United States Patent [19]

Whetsel, Jr.

[11] Patent Number: 5,353,308

[45] Date of Patent: Oct. 4, 1994

[54] EVENT QUALIFIED TEST METHODS AND CIRCUITRY

[75] Inventor: Lee D. Whetsel, Jr., Plano, Tex.

[73] Assignee: Texas Instruments Incorporated, Dallas, Tex.

[21] Appl. No.: 134,510

[22] Filed: Oct. 8, 1993

Related U.S. Application Data

[63] Continuation of Ser. No. 78,491, Jun. 17, 1993, abandoned, which is a continuation of Ser. No. 833, Jan. 5, 1993, abandoned, which is a continuation of Ser. No. 563,573, Aug. 6, 1990, abandoned.

[51] Int. Cl.$^5$ .......................................... G01R 31/28
[52] U.S. Cl. ................................. 371/22.3; 371/5.1
[58] Field of Search .................. 371/5.1, 21.1, 22.3; 324/158 R

[56] References Cited

U.S. PATENT DOCUMENTS

| | | | |
|---|---|---|---|
| 3,789,359 | 1/1974 | Clark, Jr. et al. | 371/46 |
| 4,161,276 | 7/1979 | Sacher et al. | 371/22.1 |
| 4,811,299 | 3/1989 | Miyazawa et al. | |
| 4,857,835 | 8/1989 | Whetsel, Jr. | 324/73 |
| 5,001,713 | 3/1991 | Whetsel, Jr. | 371/22.3 |
| 5,008,885 | 4/1991 | Huang et al. | 371/5.1 |
| 5,023,872 | 6/1991 | Annamalai | 371/5.1 |
| 5,048,021 | 9/1991 | Jarwala et al. | 371/22.3 |
| 5,084,874 | 1/1992 | Whetsel, Jr. | 371/22.3 |

FOREIGN PATENT DOCUMENTS 0315475 5/1989 European Pat. Off. .
0382360 8/1990 European Pat. Off. .

Primary Examiner—Charles E. Atkinson
Attorney, Agent, or Firm—Mark E. Courtney; Wade James Brady; Richard L. Donaldson

[57] ABSTRACT

An event qualification architecture comprises event qualification cells (24) having an internal memory for detecting qualification events. The event qualification cells (24) output a signal indicating when a match has occurred, which is interpreted by an event qualification module (22). The event qualification module controls the test circuitry which may include test cell registers (14, 16) and test memory (28). A number of protocols are provided which can be designed into a circuit to provide the timing and control required to activate test logic in the circuit during normal system operation.

42 Claims, 11 Drawing Sheets

EVENT QUALIFIED TEST METHODS AND CIRCUITRY

This application is a continuation of application Ser. No. 08/078,491, filed Jun. 17, 1993, now abandoned (which is a continuation of 08/000,833 mailed Jan. 5, 1993,—now abandoned which is a continuation of Ser. No. 07/563,573, now abandoned).

RELATED APPLICATIONS

This application is related to U.S. Pat. No. 5,001,723, issued Mar. 19, 1991, entitled "Event Qualified Testing Architecture for Integrated Circuits", U.S. patent application No. 374,896, filed Jun. 30, 1989, entitled "Digital Bus Monitor Integrated Circuits", U.S. Pat. No. 5,056,093 issued Oct. 8, 1991, entitled "System Scan Path Architecture", and U.S. Pat. No. 5,054,024 issued Oct. 1, 1991, entitled "System Scan Path Protocols", all of which are incorporated by reference herein.

TECHNICAL FIELD OF THE DISCLOSURE

This invention relates in general to electronic circuits, and more particularly to an event qualified test architecture.

BACKGROUND OF THE DISCLOSURE

As semiconductor technologies continue to increase the speed at which ICs operate, at-speed functional testing at both the IC and circuit board level becomes more difficult. Traditionally, circuit boards are tested at-speed using functional test equipment. Functional testers input test patterns to a board's primary inputs and measure the response from the board's primary outputs. If the primary outputs do not match the expected response the functional test fails. The cost to purchase or design high speed functional testers capable of keeping up with state-of-the-art board design is rapidly escalating.

With the recent announcement of the IEEE 1149.1 boundary scan standard, more ICs designs will include boundary scan as a method to improve board level testability. The 1149.1 standard describes a test architecture that can be designed into ICs to facilitate testing of wiring interconnects between ICs in a circuit.

The 1149.1 architecture comprises a test access port (TAP) and a series of scannable boundary test cells, one cell per input and output signal. The input test cells are combined into an input test cell register (TCR1) and the output test cells are combined into an output test cell register (TCR2).

The 1149.1 standard provides an instruction, referred to as external test (Extest) which places the IC in an off-line non-functional test mode and allows the IC's output pins to be controlled by TCR2, while the input pins are observable via TCR1. This instruction allows the wiring interconnects as well as combinational logic between ICs on a board design to be easily tested by repetitive scan access operation to TCR1 and TCR2.

In addition, the 1149.1 standard provides an instruction, referred to as Sample, which allows the ICs boundary scan path to be accessed while the IC is in an on-line functional mode. In response to control input to the TAP, the Sample instruction captures the data entering and leaving the IC in TCR1 and TCR2 then shifts it out for inspection. This test does not affect the operation of the IC.

The Sample instruction, however, has several limitations. One problem involves synchronizing the control inputs so that data can be sampled while in a stable state, not in a transitioning state. Another problem with the Sample instruction involves qualifying when the boundary data is to be sampled. In order to obtain meaningful data the sample operation should be qualified by the occurrence of an expected event. Sampling data synchronously, but at random has limited practical applications in system testing.

Still another problem with the Sample instruction is that the same control signals are routed globally to each IC on a board design to allow shifting data through all ICs during scan operations. Since each IC receives the same control signals the data sample operation must be applied globally across all IC boundaries. In typical board designs not all ICs operate on the same system clock, therefore it is impossible to obtain valid data from all IC boundaries with one sample operation.

Therefore, a need has arisen for a circuit design which will allow the board level functional testing to be performed by test logic in the IC's themselves, rather than by external test equipment. Further, the test circuitry should sample data in a stable state, respond to qualifying events, and should operate with separate system clocks.

SUMMARY OF THE DISCLOSURE

In accordance with the present invention, a testing method and apparatus is provided which substantially eliminates problems associated with prior testing methods and apparatus.

In the present invention, the occurrence of a specified event is detected and counted. Responsive to a predetermined number of occurrences, a test is executed. The test may be repeated a predetermined number of times by counting events and executing the test after receiving a predetermined number of event signals.

In one embodiment of the present invention, a second specified event may be detected and counted. Responsive to counting a predetermined number of the second specified event, the test may be stopped.

In another embodiment of the present invention, the occurrence of a specified event is detected and counted. A test is executed during a predetermined occurrence of the specified event.

The present invention provides several technical advantages over the prior art. The present invention overcomes the problems described in 1149.1 Sample instruction and provides methods to perform test functions beyond sampling single data patterns. A test may be started and stopped responsive to a predetermined occurrence of an event. The beginning or end of a test may be delayed from the predetermined occurrence by a predetermined number of clock cycles, or the test can be executed for a predetermined number of cycles. When the present invention is enabled to control a test operation, it operates independently from the circuits TAP, allowing different circuits to operate different tests at different times. Having local test controlling circuit, instead of global test control input to all circuits, decentralizes testing at the circuit board level.

Further, the present invention ability to enable boundary test logic while the host circuit is operating normally, allows testing the at-speed data transfers between circuits. The present invention provides the ability to test for at-speed related problems when physical probing of the board design is not possible or when probing affects the operation of the board.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE DISCLOSURE

The preferred embodiment of the present invention is best understood by referring to FIGS. 1-20 of the drawings, like numerals being used for like and corresponding parts of the various drawings.

Figure 1:
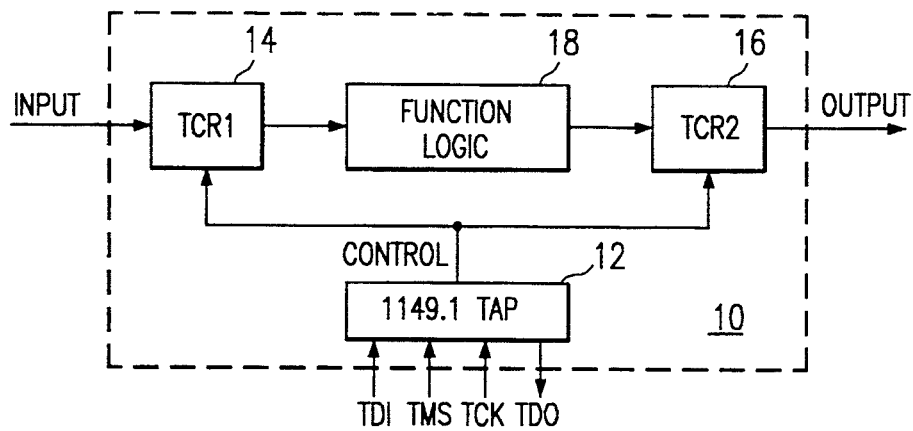
FIG. 1 illustrates an integrated circuit implementing the IEEE 1149.1 boundary scan architecture.

FIG. 1 illustrates an integrated circuit (IC) implementing the IEEE 1149.1 boundary scan architecture. The IC 10 comprises a test access port (TAP) and a series of scannable boundary test cells, one cell per input and output signal. The input test cells are combined into an input test cell register (TCR1) 14 and the output test cells are combined into an output test cell register (TCR2) 16. The function logic 18 of the IC 10 is coupled between TCR1 and TCR2.

The TAP 12 provides a serial interface into the test logic of the IC 10. The TAP 12 receives two control inputs, a test clock (TCK) and a test mode select (TMS), that regulate its operation. Also, the TAP 12 has a test data input (TDI) and a test data output (TDO) to allow serial data to be input to and output from the test architecture. Internal to the TAP 12 is an instruction register which can be serially accessed, via the TDI and TDO pins, to load test commands.

The Extest instruction places the IC 10 in an off-line, non-functional test mode and allows the IC's output pins to be controlled by TCR2, which the input pins are observable via TCR1 14. During this instruction, the TAP 12 receives external control from TMS and TCK to control the input and output pins of the IC 10 via TCR1 and TCR2. During the Extest instruction, the IC's output pins can be made to drive out test data while the input pins receive test data. This instruction allows the wiring interconnects between ICs on a board, as well as the function logic 18, to be easily tested by repetitive scan access operation to TCR1 14 and TCR2 16.

Additionally, the sample instruction allows the boundary scan path of the IC 10 to be accessed while the IC 10 is in an on-line functional mode. In response to a control input to the TAP 12, the sample instruction captures data entering and leaving the IC in TCR1 14 and TCR2 16, then shifts the captured data out for inspection. The sample test does not affect the operation of the integrated circuit 10.

In operation, however, the Sample instruction has several problems that limit its use. One problem involves synchronizing the TCK and TMS control inputs to the system data traversing the boundary of the target IC, such that the data is sampled while in a stable state, not in a transitioning state. Another problem with the Sample instruction involves qualifying the times at which the boundary data is sampled. In order to obtain meaningful data, the Sample operation should be qualified by the occurrence of an expected event. Sampling data synchronously, but at random has limited practical applications in system testing.

Yet another problem with the Sample instruction is that the TCK and TMS control signals are routed globally to each IC on a board design in order to shift data through all ICs during scan operations. Since each IC receives the same control signals, the data Sample operation must be applied globally across all IC boundaries. In a typical board design, several system clocks are used to the various ICs; therefore, it is impossible to obtain valid data from all IC boundaries with one Sample operation. Hence, in order to use the Sample instruction, the instruction is repeated with different control signals selected. Therefore, one TCK and TMS pair may be selected to operate Sample operation on one IC in the circuit, followed by selecting another TCK and TMS pair to repeat the Sample operation on another IC in the circuit.

The present invention performs at-speed system testing of a circuit comprising multiple ICs. While this disclosure describes the invention in the context of multiple ICs mounted on a board, the circuit could be used with multiple subcircuits in an IC design, multiple ICs mounted on a common substrate (wafer scale integration), or multiple circuit boards installed in a system.

Figure 2:
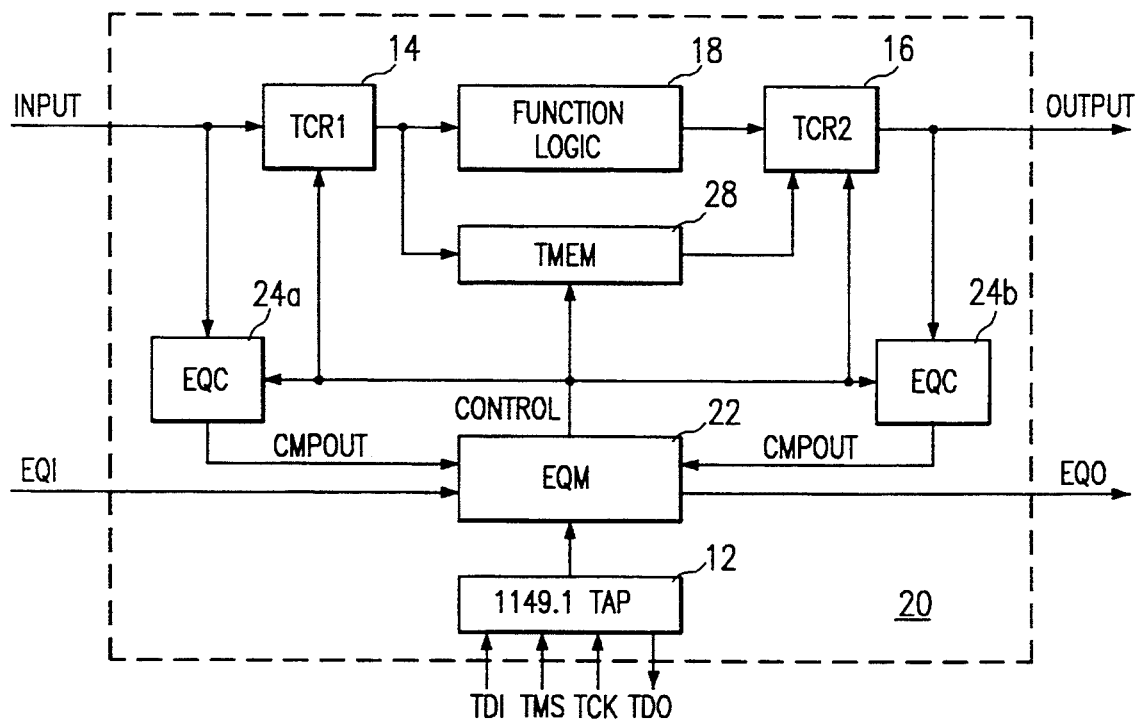
FIG. 2 illustrates a block diagram of the test architecture of the present invention.

FIG. 2 illustrates a block diagram of the present invention. An IC 20 incorporating the present invention comprises a TAP 12, TCR1 14, TCR2 16 and function logic 18, as described in connection with FIG. 1. The TAP 12 is connected to an event qualification module (EQM) 22. The EQM 22 receives an event qualification input (EQI) signal and outputs an event qualification output (EQO) signal. The EQM 22 also outputs control signals to event qualification cells 24 a–b (denoted generally by reference numeral 24), TCR1 14, TCR2 16 and a test memory (TMEM) 28. The EQM receives outputs from the EQCs 24a–b. The EQCs 24a–b receive inputs from the input signal (also connected to TCR1) and from the output of the TCR2 16, respectively. The output of TCR1 is connected to the input of the TMEM 28 and the output of the TMEM 28 is connected to the input of TCR2 16. The TAP, TCRs, EQM and TMEM are further described in connection with U.S. patent application No. 308,272, filed Feb. 8, 1989, entitled "Event Qualified Testing Architecture for Integrated Circuits", U.S. patent application No. 374,896, filed Jun. 30, 1989, entitled "Digital Bus Monitor Integrated Circuits", U.S. patent application No. 391,571, filed Au. 9, 1989, entitled "System Scan Path Architecture", and U.S. patent application No. 391,801, filed Aug. 9, 1989, entitled "System Scan Path Protocols", to Whetsel, all of which are incorporated by reference herein.

When attempting to use boundary test logic to perform at-speed functional testing, a method of qualifying when to issue control to enable the test logic is necessary. The event qualification architecture of the present invention provides such a method by placing the qualification and control logic, required for enabling test logic, within the IC design itself, thus eliminating the need for external test control. When qualified, the architecture takes control of the host IC's boundary (or other) test logic and causes it to operate synchronous with the IC during test.

An event qualification cell (EQC) is coupled with each IC input and output signal that can serve, either by itself or in combination with other signals, as a test qualifier. In addition, a local controller referred to as an event qualification module (EQM) 22 is included in the IC 20 to provide the local qualification and control for the IC's test logic.

The EQCs 24a–b and EQM 22 are both selectable by the TAP 12 to allow serial access to the architecture. The architecture does not inhibit any of the IEEE 1149.1 test operations. The architecture provides an embedded capability allowing TCR1 14 and TCR2 16 to be synchronously enabled with the IC's I/O data at a qualified time, to effectuate on-line testing at the ICs boundary.

The TCRs 14 and 16 can be set up to operate as either observability or controllability logic. When the TCRs are in an observability mode, they can be further setup to either take a snap-shot sample of a single data pattern entering and/or leaving the IC 20, or to allow multiple data patterns to be compressed into a signature, using signature analysis techniques. The data sample observation mode allows testing a single input and/or output data pattern, whereas the signature analysis observation mode allows testing for a correct sequence of multiple input and/or output data patterns. If the signature matches an expected signature, the data patterns sequence is correct, otherwise one or more of the data patterns in the sequence had an error.

When the TCRs 14 and 16 are in a controllability mode, they can be setup to insert either a single test data pattern or a generated sequence of pseudo-random or counting patterns in place of the normal system data entering and/or leaving the IC. In some test situations, one TCR may be setup to perform a control function, while the other TCR performs an observation function.

In addition to the TCR1 14 and TCR2 16 test logic blocks, the IC 20 contains a test memory (TMEM) 28 which can be setup to store input data entering the IC and/or insert stored test data in place of system data normally output from the IC. The advantage the memory has over the TCRs is the ability to store and/or output multiple test data patterns. The memory, like the TCRs 14 and 16, can be serially accessed via the TAP 12 to load or unload test data.

During on-line system testing the TCRs 14 and 16 and TMEM 28 receive control from the EQM 22, not the TAP 12, to operate the observability and/or controllability test functions setup in each. Using the TCRs 14 and 16 and TMEM 28, it is possible to setup the test architecture to perform any of the tests described above either individually or in any combination. A list of the test operations and their combinations are shown in Table 1.

TABLE 1—TEST OPERATIONS

Single Test Operations

Test Mode 1: TCR1 samples input data
Test Mode 2: TCR1 compresses input data
Test Mode 3: TCR1 inserts input data
Test Mode 4: TCR1 generates input data
Test Mode 5: TCR2 samples output data
Test Mode 6: TCR2 compresses output data
Test Mode 7: TCR2 inserts output data
Test Mode 8: TCR2 generates output data
Test Mode 9: TMEM stores input data
Test Mode 10: TMEM sources output data Combined Test Operations Test Mode 11: TMEM stores input data, while TMEM sources output data
Test Mode 12: TCR1 samples input data, while TCR2 samples output data
Test Mode 13: TCR1 samples input data, while TCR2 compresses output data
Test Mode 14: TCR1 samples input data, while TCR2 inserts output data
Test Mode 15: TCR1 samples input data, while TCR2 generates output data
Test Mode 16: TCR1 samples input data, while TMEM sources output data
Test Mode 17: TCR1 compresses input data, while TCR2 samples output data
Test Mode 18: TCR1 compresses input data, while TCR2 compresses output data
Test Mode 19: TCR1 compresses input data, while TCR2 inserts output data
Test Mode 20: TCR1 compresses input data, while TCR2 generates output data
Test Mode 21: TCR1 compresses input data, while TMEM sources output data
Test Mode 22: TCR1 inserts input data, while TCR2 samples output data
Test Mode 23: TCR1 inserts input data, while TCR2 compresses output data
Test Mode 24: TCR1 inserts input data, while TCR2 inserts output data
Test Mode 25: TCR1 inserts input data, while TCR2 generates output data
Test Mode 26: TCR1 inserts input data, while TMEM stores input data
Test Mode 27: TCR1 inserts input data, while TMEM sources output data
Test Mode 28: TCR1 generates input data, while TCR2 samples output data
Test Mode 29: TCR1 generates input data, while TCR2 compresses output data
Test Mode 30: TCR1 generates input data, while TCR2 inserts output data
Test Mode 31: TCR1 generates input data, while TCR2 generates output data
Test Mode 32: TMEM stores input data, while TCR2 samples output data
Test Mode 33: TMEM stores input data, while TCR2 compresses output data
Test Mode 34: TMEM stores input data, while TCR2 inserts output data
Test Mode 35: TMEM stores input data, while TCR2 generates output data Test Mode 36: TMEM sources output data, while TCR1 samples input data
Test Mode 37: TMEM sources output data, while TCR1 compresses input data
Test Mode 38: TMEM sources output data, while TCR1 inserts input data
Test Mode 39: TMEM sources output data, while TCR1 generates input data Event Qualification Cells (EQCs)

The basic task of the EQCs 24a-b is comparing a received signal against a stored signal, and outputting a signal to indicate when the two signals match. While the application of EQCs 24a-b in this disclosure describes their use at the input and output boundaries of an IC design, it must be understood that they can be used at the boundary of any well defined logic block that has inputs and/or outputs for signal data.

Figure 3:
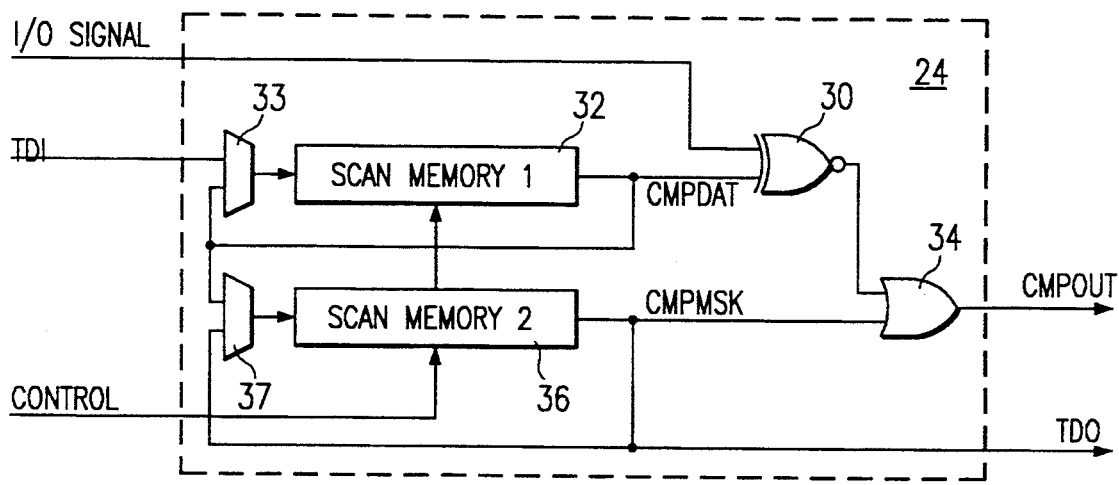
FIG. 3 illustrates a block diagram of an event qualification cell.
Figure 4:
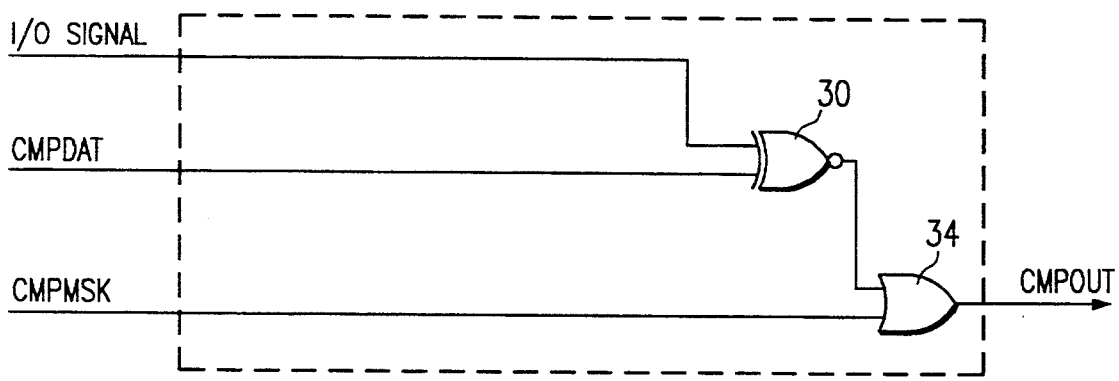
FIG. 4 illustrates a block diagram of an alternative embodiment of an event qualification cell.

FIG. 3 illustrates a block diagram of an EQC 24. An I/O signal, such as that supplied by the INPUT signal to EQC 24a or the output of TCR2 16 to EQC 24b, is coupled to one input of an exclusive NOR gate 30. The other input to the XNOR gate 30 is received from the output of a scan memory cell 32. The input of the scan memory cell 32 is coupled to a multiplexer 33 and control is input from the EQM 22. The multiplexer 33 inputs the TDI signal and the output of the scan memory 32. The output of the XNOR gate 30 is connected to the input of a OR gate 34; the other input to the OR gate 34 is supplied by the output of a second scan memory cell 36. The input of the scan memory cell 36 is connected to a multiplexer 37 and control is input from the EQM 22. Multiplexer 37 inputs the output of scan memory 32 and the output of scan memory 36. The output of the scan memory cell 36 is coupled to the TDO output signal. The output of the OR gate 34 comprises the CMPOUT signal, which is connected to the EQM 22.

The EQC 24a in FIG. 3 contains compare circuitry (XNOR gate 30) and scannable memories 32 and 36 for storing a plurality of compare data (CMPDAT) and compare mask (CMPMSK) bits. The EQCs 24 have inputs for receiving the boundary I/O signal to be compared and for receiving control from the EQM 22. The EQCs 24 have a compare output (CMPOUT) to transmit the result of the compare operation to the EQM 22. When a match occurs between the I/O signal and the CMPDAT bit being output from memory 32, the CMPOUT output transmits a match signal to the EQM 22 to indicate the occurrence of the match. The EQC's compare circuitry can be disabled by the CMPMSK bit output from memory 36, so that the EQC outputs a match signal on CMPOUT regardless of whether a match occurred between the I/O signal and CMPDAT bit. The memories output the CMPDAT and CMPMSK bits to the compare logic simultaneously, allowing three possible operations: compare I/O signal against a logic one, compare I/O signal against a logic zero, or mask compare operation and force a true compare output. Compare masking allows assigning "don't care" conditions to one or more I/O signals that are not required in the qualification of a particular test operation.

The memories 32 and 36 are typically simple shift registers of equal length. When accessed by the TAP 12 (via the EQM), the memories are linked together via Mux 37 to allow shifting data into and out of the memories via the TDI and TDO pins. During scan access all the EQCs in the IC are linked together to form a serial shift register. The EQC shift register is coupled to the IC's TDI input and TDO output pins during the scan operation to allow data to be input to and output from the EQC shift register. When they are not being accessed by the TAP 12 for shift operations, the memories can be controlled by the EQM 22 to output CMPDAT and CMPMSK data bits to the compare circuit during the execution of one of the EQM's protocols.

In operation, the TAP 12 loads the memories with CMPDAT and CMPMSK data bits to be used in an EQM protocol. After the memories are loaded the TAP 12 accesses the EQM 22 to load a protocol command and enable the EQM 22 to control the memories. The serial output of each memory 32 and 36, following the shift operation, is the first CMPDAT and CMPMSK data bits used in the EQM's first compare operation. After the first compare operation completes, the EQM issues control to the memories 32 and 36 to shift out a second pair of CMPDAT and CMPMSK data bits that are to be used on a second compare operation. When the memories 32 and 36 output the next pair of CMPDAT and CMPMSK bits, the previous bit pair is fed back into the respective memories via Mux 33 and 37 and stored into the memories. By circulating the bit pairs back through the memories, a compare output sequence can be repeated an infinite number of times.

While the EQM 22 has protocols that operate on a single CMPDAT and CMPMSK bit storage, other protocols require storage of multiple CMPDAT and CMPMSK data bits. The CMPDAT and CMPMSK memories should be able to store at least two bits each, to allow outputting two pairs of CMPDAT and CMPMSK data bits. Two pairs of CMPDAT and CMPMSK bits allow the EQM to start a test operation in response to a condition detected with the first pair, then stop the test operation in response to a condition detected with the second pair. Some of the test protocols executed by the EQM 22 may require additional storage of CMPDAT and CMPMSK data bits to allow multiple start/stop and/or other compare operations required for testing.

Figure 5:
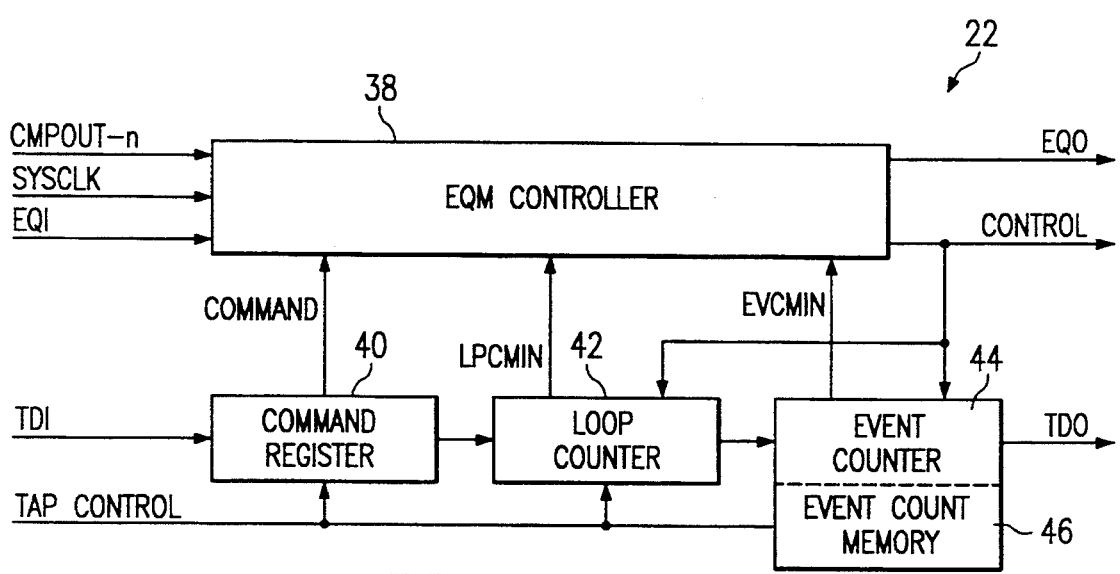
FIG. 5 illustrates a block diagram of an event qualification module.

To allow more efficient storage of CMPDAT and CMPMSK data, a single remote memory may be used instead of having local memories inside each EQC. The EQC of FIG. 5 illustrates the cell design without the local memories 32 and 36. The function of the EQC 24 is the same, the only difference is that the CMPDAT and CMPMSK bit signals are stored in a remote memory instead of in the cell itself.

Event Qualification Module (EQM)

FIG. 5 illustrates a block diagram of an EQM comprising a finite state machine controller 38 and a scan path comprising command register 40, loop counter 42, and event counter 44. The controller has inputs for receiving the CMPOUT signals (CMPOUT 1-n) from the EQCs 24, a system clock (SYSCLK), an external event qualification input (EQI) signal, a command from the command register 40, a loop count minimum (LPCMIN) signal from the loop counter 42, and a event count minimum (EVCMIN) signal from the event counter 44 coupled to an event count memory 46. The controller 39 has outputs for controlling test logic and EQCs and for outputting an external event qualification output (EQO) signal. While not shown in FIG. 1, the controller also receives a system clock from either the IC's function logic or from an external system clock input. The system clock driving the EQM's controller is synchronous with the I/O boundary data. Synchronizing the controller with the system clock allows it, as well as the test logic it controls, to operate synchronous to the system logic being tested. The EQM's scan path receives scan control input (TAP CONTROL) from the TAP to allow data to be shifted into and out of the scan path via the TDI and TDO signals. The command register 40 of the scan path comprises a series of scan cells (flip-flops or latches) which can be loaded via a scan operation to output a command to the EQM controller 38. The loop counter section comprises a series of scan cells which can be loaded via a scan operation with a count value. When data is not being shifted through the loop counter 42, it can receive control from the controller 38 to operate as a count down counter. The loop counter 42 outputs a loop count minimum signal (LPCMIN) to the controller to indicate when it has counted down to a minimum count value.

The event counter section 44 comprises a series of scan cells which can be loaded via a scan operation with a count value. The count value loaded in the event counter 44 can be written to the event count memory 46 attached to the counter's parallel outputs to allow storing multiple count values. When data is not being shifted through the event counter 44 it can receive control from the controller 38 to operate as a count down counter. The event counter 44 outputs an event counter minimum signal (EVCMIN) to the controller to indicate when it has counted down to a minimum count value. Since the event counter 44 has a memory for storing multiple count values, it can receive control from the controller to load a new count value when the present count reaches a minimum value. This ability to reload new count values from the memory allows the EQM controller to execute sophisticated test protocols, as will be described later.

EQM Controller

Figure 6:
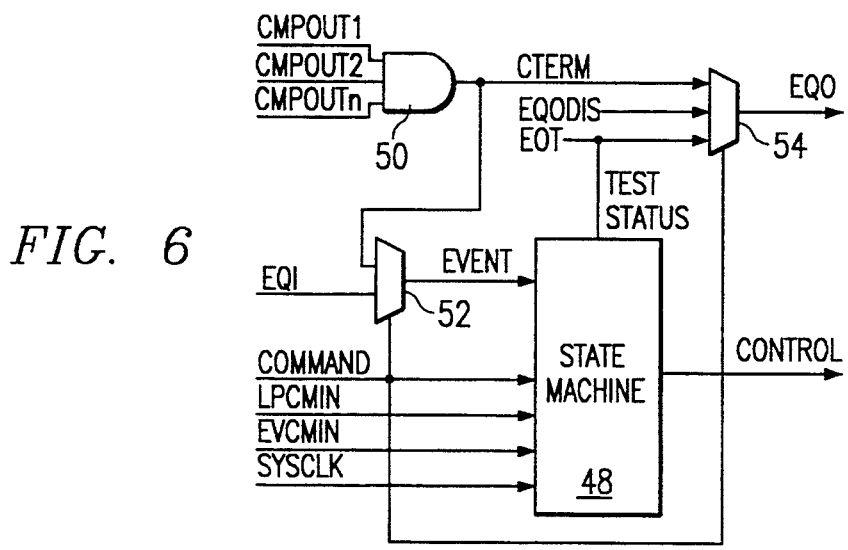
FIG. 6 illustrates a block diagram of the event qualification module controller.

FIG. 6 illustrates a block diagram of the EQM controller 38. The EQM controller 38 comprises a finite state machine 48, an AND gate 50 used for combining the CMPOUT signals into a single compare term signal (CTERM), a first multiplexer (Mux1) 52 for selecting the EVENT signal to be input to the state machine 48, and a second multiplexer (Mux2) 54 for selecting the signal to be output on the EQO output. The state machine 48 receives the EVENT signal from Mux1 52, the COMMAND input from the command register 40, the LPCMIN input from the loop counter 42, the EVCMIN input from the event counter 44, and the SYSCLK from the IC's function logic 18 or an input pin. The state machine 48 outputs control signals to the boundary test logic and the EQCs 24a-b and also outputs test status which can be selected and output on the EQO output, via Mux2 54.

The COMMAND input instructs the state machine 48 to execute a selected test protocol and controls the select input of Mux1 52 and Mux2 54. During the execution of a protocol, the state machine 48 monitors the EVENT output from Mux1 52. When Mux1 52 is set to output the CTERM as the EVENT signal, the state machine 48 monitors the CTERM signal to determine when to issue control to start and stop a test operation. The CTERM signal is selected by Mux1 52 when qualification of a test operation is based only on the local boundary conditions occurring at the host IC (see "Board Level-Local Event Qualification" section hereinbelow).

Alternately, when Mux1 52 is set to output the EQI input as the EVENT signal, the state machine 48 monitors the EQI signal to determine when to issue control to start and stop a test operation. The EQI signal is selected when qualification of a test operation is not based only on the local boundary conditions of the host IC, but rather over a range of IC boundary conditions and/or other external conditions generated on or input to the board design (see "Board Level—Global Event Qualification" section hereinbelow).

The command input also selects which of the CTERM signal, an end-of-test (EOT) status signal from the state machine 48, or an EQO disable (EQODIS) signal is output on the EQO pin via Mux2 54. The CTERM signal is selected and output on the EQO pin when the EQM is operating in a global qualification mode (see "Board Level—Global Event Qualification" section below). The EOT status signal is selected and output on the EQO pin when the EQM is operating in a local qualification mode (see "Board Level—Local Event Qualification" section below). The EOT signal goes active at the end of each protocol, indicating that the test operation controlled by the protocol is complete. When the EQODIS signal is selected and output on the EQO pin, the IC's EQO pin is disabled and has no affect on any external voting or other circuit to which it may be input (see FIG. 18).

EQM Controller Test Protocols

Figure 7:
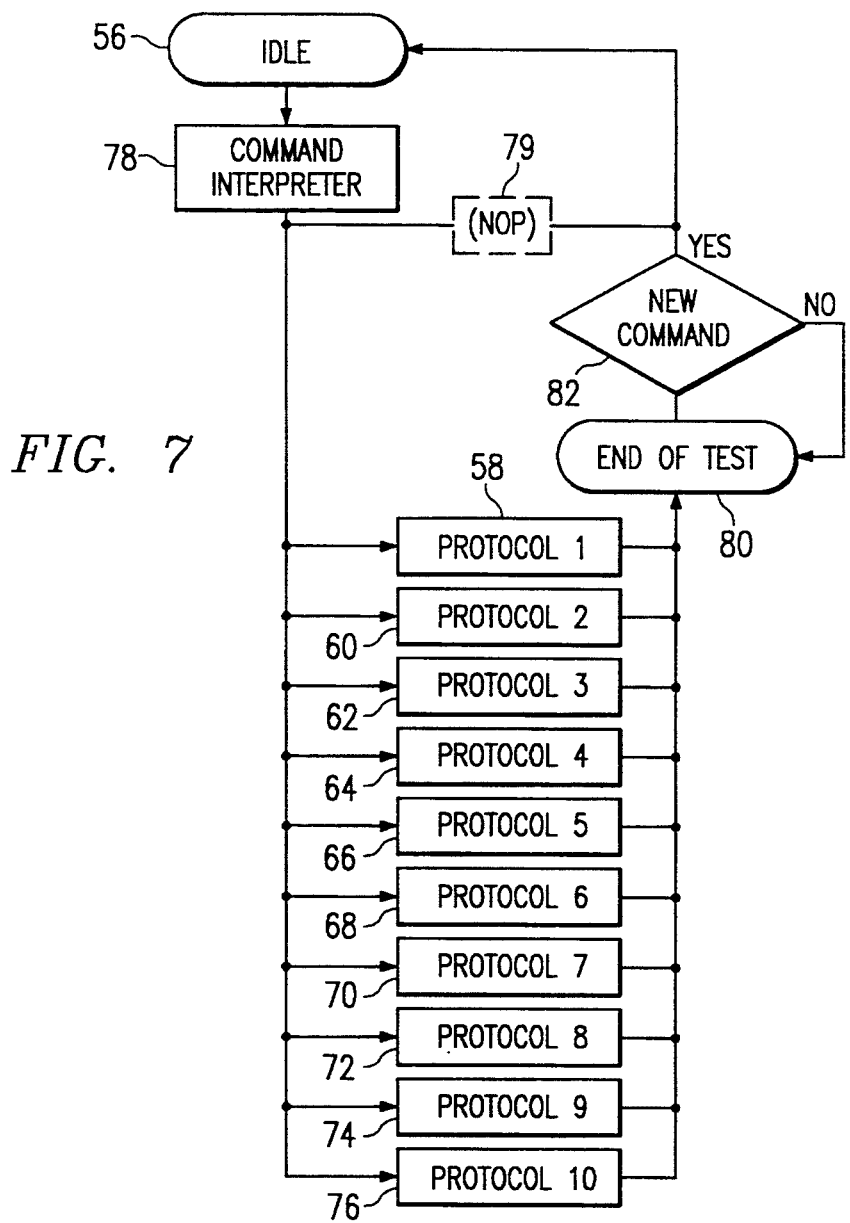
FIG. 7 illustrates a flow chart depicting how the state machine of the event qualification module controller selects test protocols.

The state machine 48 of the EQM controller 38 contains commands for selecting and executing one of the test protocols shown in the state diagram of FIG. 7 below. A no-operation (NOP) command is input to the EQM controller 38 when no test protocol is to be executed. FIG. 7 illustrates how the state machine 48 decodes the COMMAND input to select one of the test protocols or the NOP command. When a protocol command is input, the state machine 48 leaves the Idle state 56 and enters one of the protocol 58-76 as interpreted by the command interpreter 78. During the execution of the protocol, the EQM outputs control that can be used to enable the test logic of the IC in FIG. 2 to perform any of the test operations listed in Table 1. If no protocol is executed, the state machine 48 returns to the idle state 56 through the NOP command 79.

After a protocol has been executed, the "end of test" state 80 is entered prior to returning to the Idle state 56. The controller 38 will stay in the "end of test" state until the next command is input as shown by decision block 82. While in the "end of test" state the EOT status signal shown in FIG. 6 is set and can be output from the EQO pin via Mux2. The reason for selecting the EOT signal to be output on the EQO pin is described in the "Board Level—Local Event Qualification" section of this specification.

All of the protocols 58-76 make use of the event and loop counters 44 and 42 shown in connection with the state machine of FIG. 5. The event counter 44 is a count down counter used to either count the number of events or system clocks that are input to the state machine 48. When using the event counter 44 to count events, it is possible to cause the state machine 48 to respond to an "Nth" event, where N equals a count value loaded into the event counter 44, instead of on the first event. Being able respond to a programmable 1st, 2nd, or nth event to start and to stop a test operation enhances the event qualification architectures' ability to effectuate test or other operations in response to event inputs. The loop counter 42 is a count down counter primarily used to count the number of times a protocol is to be repeated. When the loop counter 42 is loaded with a count of "M" the protocol will repeat exactly "M" times.

Protocol 1

Figure 8:
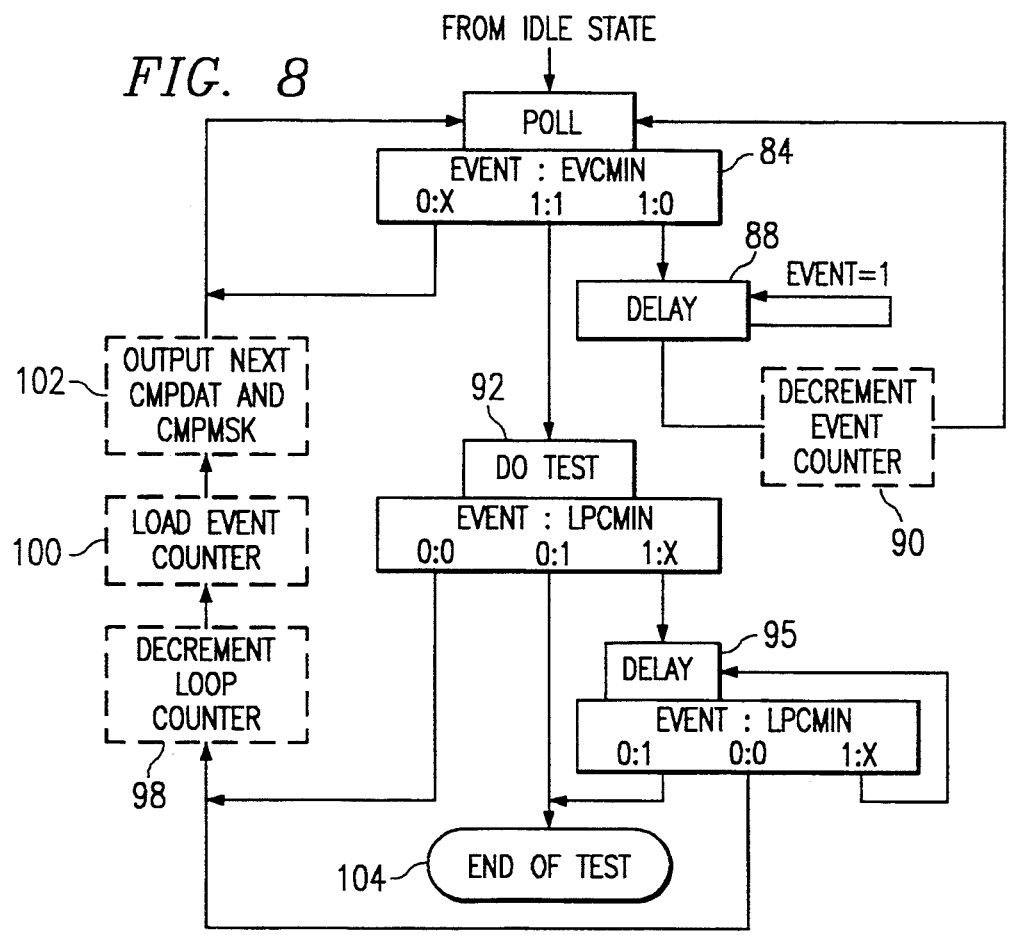
FIGS. 8-17 illustrate state diagrams of test protocols.

Protocol 1 allows a test or other procedure to occur once in response to an "Nth" event, and be repeated "M" times, as illustrated by the pseudo-code below and state diagram in FIG. 8. For purposes of this specification, a "state" is a logical position in a state diagram. The states in a state diagram are illustrated as being directed such that one state transitions into one of the other states either automatically or in response to a condition input. The way the states are directed defines the function of the state diagram. States can exist as one of two types, temporary states and steady states. Temporary states are entered into on one clock and exited from on the next subsequent clock, i.e., a temporary state cannot loop back into itself. Steady states can be entered into on one clock and either exited from or looped back into on the next subsequent clock.

An "action" is a predefined operation performed when a state diagram transitions from one state to another state. The state machine outputs control to external logic to achieve the action. Actions are shown in the FIGUREs in dashed boxes.

During this protocol the event counter 44 of FIG. 5 is used to delay the start of the operation until "N" occurrences of the event have been detected (state 84). Each time the state machine 48 detects the expected event (EVENT=1), it checks the event counter's EVCMIN signal to see if the counter is at a minimum count (EVCMIN=1). If an event is detected and the event counter 44 is not at a minimum count, the state machine 48 waits for the event input to go away (state 88) then decrements the event counter 44 once (action 90) and begins monitoring for the next occurrence of the same event. If an event is detected and the event counter 44 is at a minimum count, the state machine 48 issues control to execute a single test operation (state 92) and then waits for the event to finish (state 95).

The loop counter 42 is used to allow the above described protocol to be repeated "M" times. After each pass through the protocol, the state machine 48 checks the loop counter's LPCMIN signal to see if the loop counter 42 is at a minimum count (state 95). If the loop counter 42 is not at a minimum count (LPCMIN=0), the state machine 48 decrements the loop counter 42 once (action 98), issues control to load a new "N" count into the event counter 44 (action 100), causes the memories in the EQCs to output a new pair of CMPDAT and CMPMSK signals (action 102), and repeats the protocol sequence described above. If the loop counter 42 is at a minimum count (LPCMIN=1), the state machine 48 transitions into the "end of test" state 104 to terminate the protocol. The pseudo-code for Protocol 1 is:

```
For "M" times do:
    Begin
        On "Nth" event do test
    End
End of Test
```

Protocol 2

Figure 9:
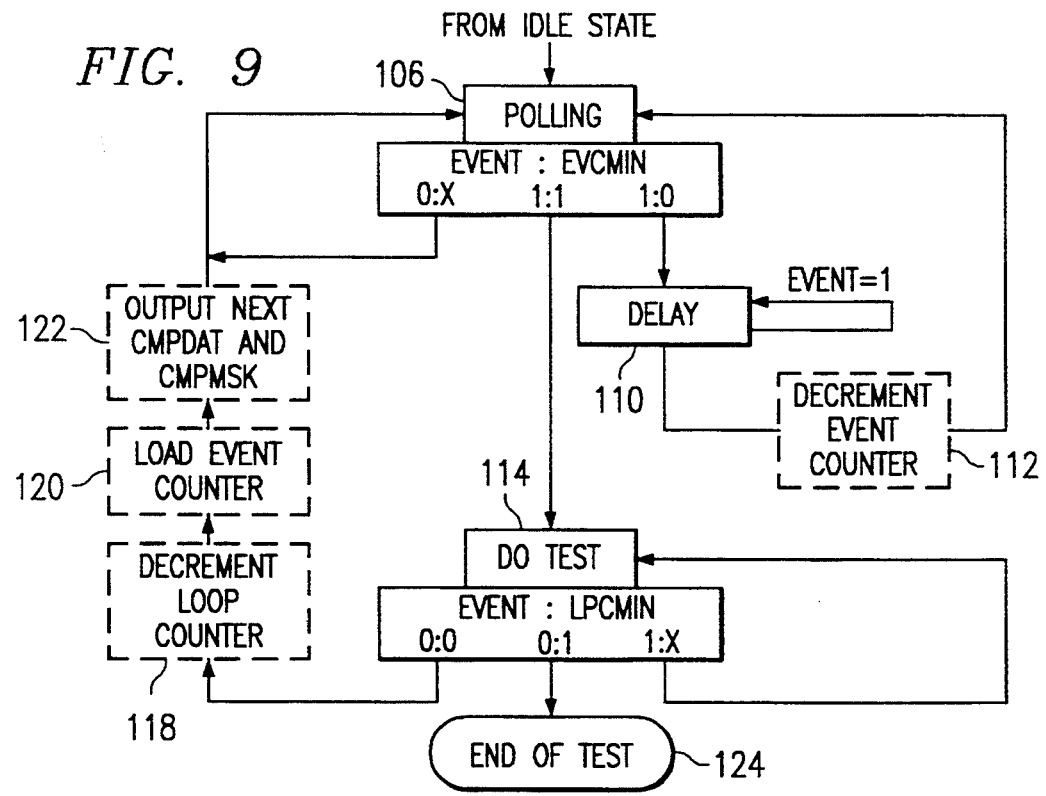

Protocol 2 operation allows a test or other procedure to occur while an "Nth" event is present and repeated "M" times, as illustrated by the pseudo-code below and the state diagrams in FIG. 9.

During this protocol the event counter 44 of FIG. 5 is used to delay the start of the operation until "N" occurrences of the event have been detected. Each time the state machine 48 detects the expected event, it checks the event counter's EVCMIN signal to see if the counter is at a minimum count (state 106). If an event is detected and the event counter 44 is not at a minimum count in state 106, the state machine 48 waits for the event input to go away (state 110), then decrements the event counter 44 once (action 112) and begins monitoring for the next occurrence of the same event. If an event is detected and the event counter 44 is at a minimum count, the state machine 48 issues control to execute a test operation while the event input is present (state 114). When the event input goes away, the state machine 48 terminates the test operation.

The loop counter 42 is used to allow the above described protocol to be repeated "M" times. After each pass through the protocol, the state machine 48 checks the loop counter's LPCMIN signal (state 114) to see if the counter is at a minimum count. If the loop counter 42 is not at a minimum count, the state machine 48 decrements the loop counter 42 once (action 118), issues control to load a new "N" count into the event counter 44 (action 120), causes the memories in the EQCs to output a new pair of CMPDAT and CMPMSK signals (action 122), and repeats the protocol sequence described above. If the loop counter 42 is at a minimum count, the state machine 48 transitions into the "end of test" state 124 to terminate the protocol.

The pseudo-code for Protocol 2 is:

```
For "M" times do
    Begin
        During "Nth" event do test
    End
End of test
```

Protocol 3

Figure 10:
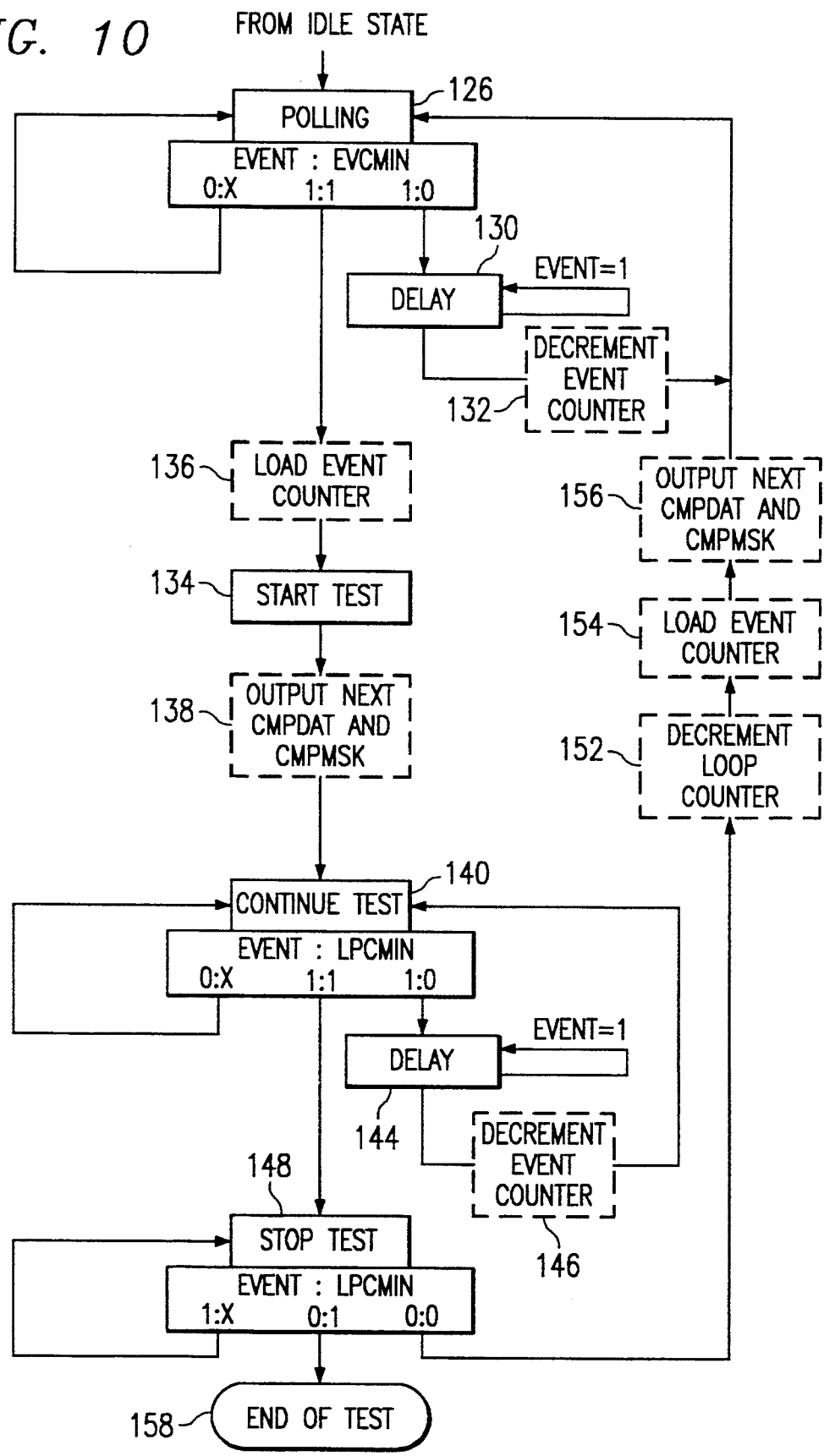

Protocol 3 operation allows a test or other procedure to be started in response to a first "Nth" event, stopped in response to a second "Nth" event, and repeated "M" times, as illustrated by the pseudo-code below and state diagrams in FIG. 10.

During this protocol, the event counter 44 of FIG. 5 is used to delay the start of the operation until "N" occurrences of a first event have been detected. Each time the state machine 48 detects the expected first event it checks the event counter's EVCMIN signal to see if the counter is at a minimum count (state 126). If an event is detected and the event counter 44 is not at a minimum count, the state machine 48 waits for the event input to go away (state 130) then decrements the event counter 44 once (action 132) and begins monitoring for the next occurrence of the same event. If an event is detected and the event counter 44 is at a minimum count, the state machine 48 issues control to start a test operation (state 134). When the detected event that starts the test operation goes away, the state machine 48 issues control to load the event counter 44 with a new "N" count (action 136) and to cause the memories inside the EQCs to output a new pair of CMPDAT and CMPMSK signals (action 138) to be used to compare against a second "Nth" event that will stop the test operation (state 140).

While the state machine 48 monitors for the second "Nth" event that will stop the test operation (state 140), it continues issuing control to maintain the test operation. Each time the state machine 48 detects a second event it checks the event counter's EVCMIN signal to see if the counter is at a minimum count. If an event is detected and the event counter 44 is not at a minimum count, the state machine 48 waits for the event input to go away (state 144) then decrements the event counter 44 once and begins monitoring for the next occurrence of the same event (action 146). If an event is detected and the event counter 44 is at a minimum count, the state machine 48 issues control to stop the test operation (state 148).

The loop counter 42 is used to allow the above described protocol to be repeated "M" times. After each pass through the protocol, the state machine 48 checks the loop counter's LPCMIN signal to see if the counter is at a minimum count (state 148). If the loop counter 42 is not at a minimum count, the state machine 48 decrements the loop counter 42 once (action 152), issues control to load a new "N" count into the event counter 44 (action 154), causes the memories in the EQCs to output a new pair of CMPDAT and CMPMSK signals (action 156), and repeats the protocol sequence described above. If the loop counter 42 is at a minimum count, the state machine 48 transitions into the "end of test" state 158 to terminate the protocol. The pseudo-code for Protocol 3 is:

```
For "M" times do
  Begin
    On "Nth" event start test
    On "Nth" event stop test
  End
End of test
```

Protocol 4

Figure 11:
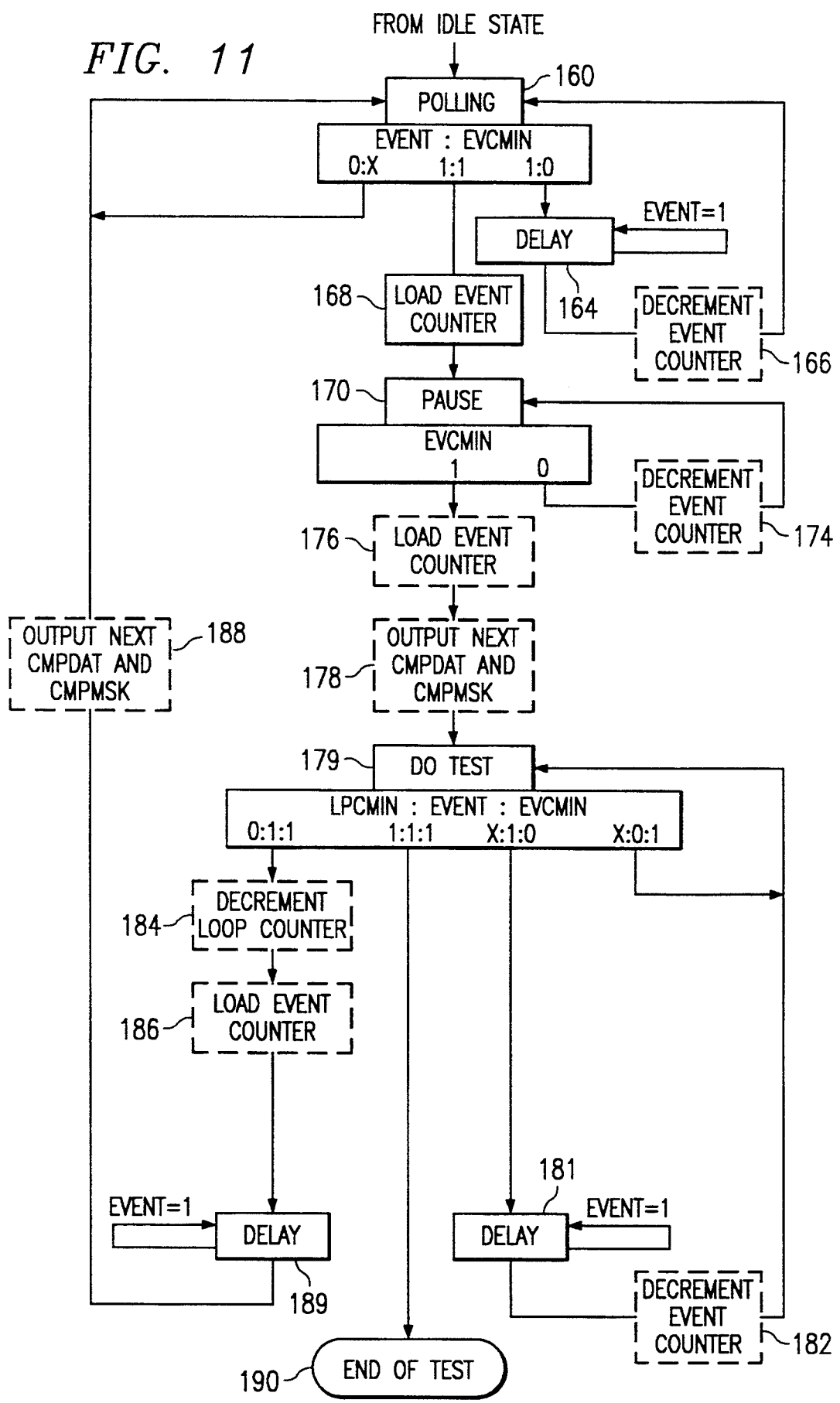

Protocol 4 operation allows a test or other procedure to be started "N" clocks after the detection of a first "Nth" event, stopped in response to a second "Nth" event, and repeated "M" times as illustrated by the pseudo-code below and state diagram in FIG. 11.

During this protocol, the event counter 44 of FIG. 5 is used to delay the start of the operation until "N" occurrences of a first event have been detected. Each time the state machine 48 detects the expected first event it checks the event counter's EVCMIN signal to see if the counter is at a minimum count (state 160). If an event is detected and the event counter 44 is not at a minimum count, the state machine 48 waits for the event input to go away (state 164) then decrements the event counter 44 once (action 166) and begins monitoring for the next occurrence of the first event. If an event is detected and the event counter 44 is at a minimum count, the state machine 48 loads a new "N" count into the event counter 44 (action 168) and begins decrementing the event counter 44 once for each system clock input (state 170 and action 174).

When the event counter 44 reaches a minimum count, indicated by the EVCMIN signal, the state machine 48 issues control to start the test operation, load the event counter 44 with a new "N" count (action 176), and cause the memories inside the EQCs to output a new pair of CMPDAT and CMPMSK signals (action 178) to be used to compare against a second "Nth" event that will stop the test operation. The ability to delaying the start of a test operation for a predetermined number of clocks allows starting the test operation (state 179) at some point in time after the starting event occurs.

After the test is started the state machine 48 uses the event counter 44 to delay stopping the test operation until "N" occurrences of the second event have been detected. Each time the state machine 48 detects the expected second event it checks the event counter's EVCMIN signal to see if the counter is at a minimum count (state 170). If an event is detected and the event counter 44 is not at a minimum count, the state machine 48 waits for the event input to go away (state 181) then decrements the event counter 44 once and begins monitoring for the next occurrence of the second event (action 182). If an event is detected and the event counter 44 is at a minimum count, the state machine 48 issues control to stop the test operation.

The loop counter 42 is used to allow the above described protocol to be repeated "M" times. After each pass through the protocol, the state machine 48 checks the loop counter's LPCMIN signal to see if the counter is at a minimum count. If the loop counter 42 is not at a minimum count, the state machine 48 decrements the loop counter 42 once (action 184), and issues control to load a new "N" count into the event counter 44 (action 186). After the event goes away (state 189), the state machine outputs continue causing the memories in the EQCs to output a new pair of CMPDAT and CMPMSK signals (action 188), and repeats the protocol sequence described above. If the loop counter 42 is at a minimum count, the state machine 48 transitions into the "end of test" state to terminate the protocol (state 190).

The pseudo-code for Protocol 4 is:

```
For "M" times do
  Begin
    On "Nth" event start test after "N" clocks
    On "Nth" event stop test
  End
End of test
```

Protocol 5

Figure 12:
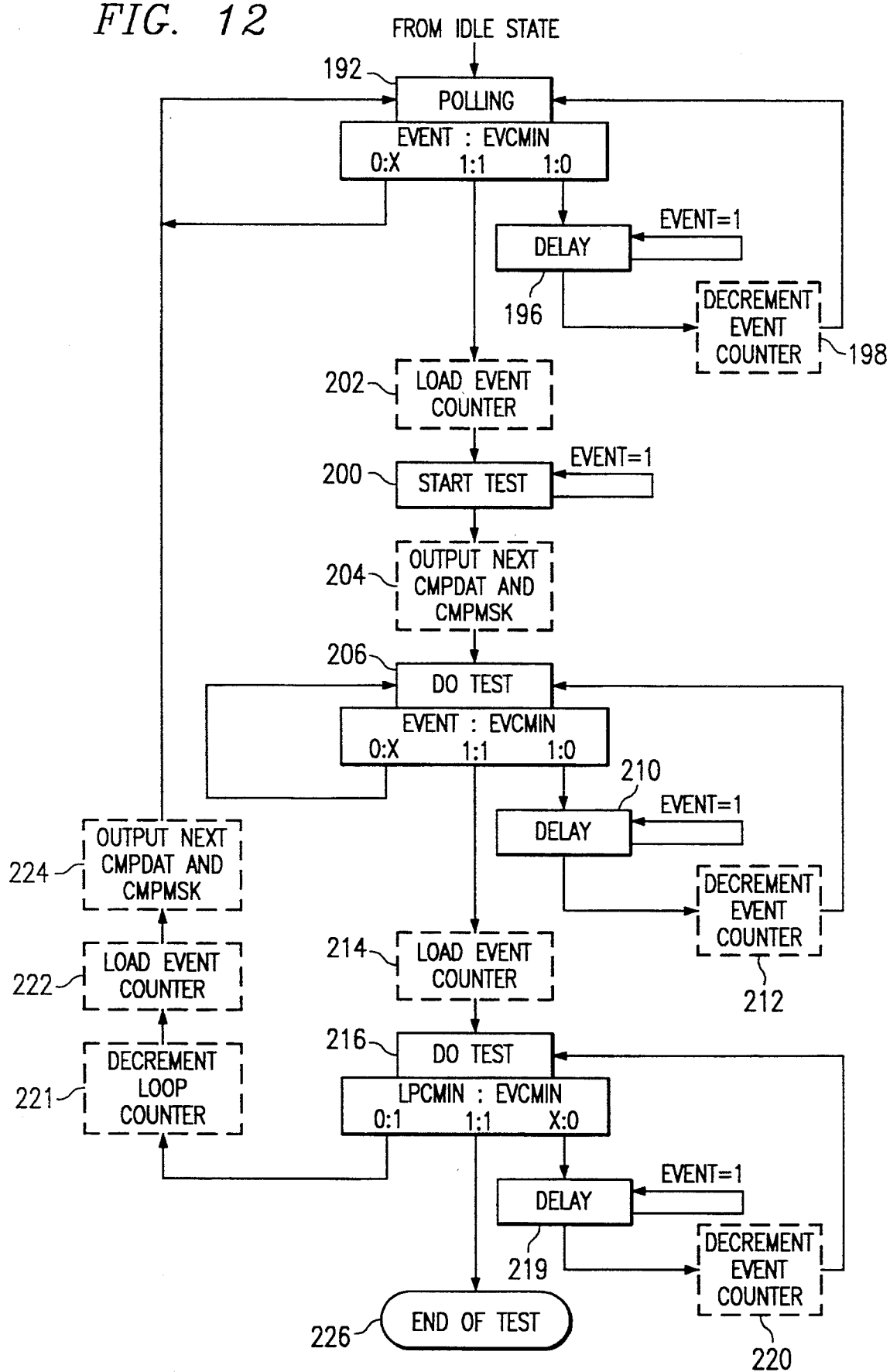

Protocol 5 operation allows a test or other procedure to be started in response to a first "Nth" event, stopped "N" clocks after the detection of a second "Nth" event, and repeated "M" times as illustrated by the pseudo-code below and state diagrams in FIG. 12.

During this protocol, the event counter 44 of FIG. 5 is used to delay the start of the operation until "N" occurrences of a first event have been detected. Each time the state machine 48 detects the expected first event it checks the event counter's EVCMIN signal to see if the counter is at a minimum count (state 192). If an event is detected and the event counter 44 is not at a minimum count, the state machine 48 waits for the event input to go away (state 196) then decrements the event counter 44 once (action 198) and begins monitoring for the next occurrence of the first event. If an event is detected and the event counter 44 is at a minimum count, the state machine 48 issues control to start the test operation (state 200), load a new "N" count into the event counter 44 (action 202) and cause the memories inside the EQCs to output a new pair of CMPDAT and CMPMSK signals (action 204) to be used to compare against a second "Nth" event that will initiate the stoppage sequence of the test operation.

After the test is started the state machine 48 uses the event counter 44 to delay stopping the test operation until "N" occurrences of the second event have been detected. Each time the state machine 48 detects the expected second event it checks the event counter's EVCMIN signal to see if the counter is at a minimum count (state 206). If an event is detected and the event counter 44 is not at a minimum count, the state machine 48 waits for the event input to go away (state 210) then decrements the event counter 44 once (action 212) and begins monitoring for the next occurrence of the second event. If an event is detected and the event counter 44 is at a minimum count, the state machine 48 loads a new "N" count into the event counter 44 (action 214) and begins decrementing tile event counter 44 once for each system clock input (states 216 and 219 and action 220). When the event counter 44 reaches a minimum count, indicated by the EVCMIN signal, the state machine 48 issues control to stop the test operation. The capability of delaying the stopping of a test operation for a predetermined number of clocks allows stopping the test operation at some point in time after the stopping event occurs.

The loop counter 42 is used to allow the above described protocol to be repeated "M" times. After each pass through the protocol, the state machine 48 checks the loop counter's LPCMIN signal to see if the counter is at a minimum count (state 216). If the loop counter 42 is not at a minimum count, the state machine 48 decrements the loop counter 42 once (action 221), issues control to load a new "N" count into the event counter 44 (action 222), causes the memories in the EQCs to output a new pair of CMPDAT and CMPMSK signals (action 224), and repeats the protocol sequence described above. If the loop counter 42 is at a minimum count, the state machine 48 transitions into the "end of test" state 226 to terminate the protocol.

The pseudo-code for Protocol 5 is:

```
For "M" times do
  Begin
    On "Nth" event start test
    On "Nth" event stop test after "N" clocks
  End
End of test
```

Protocol 6

Figure 13:
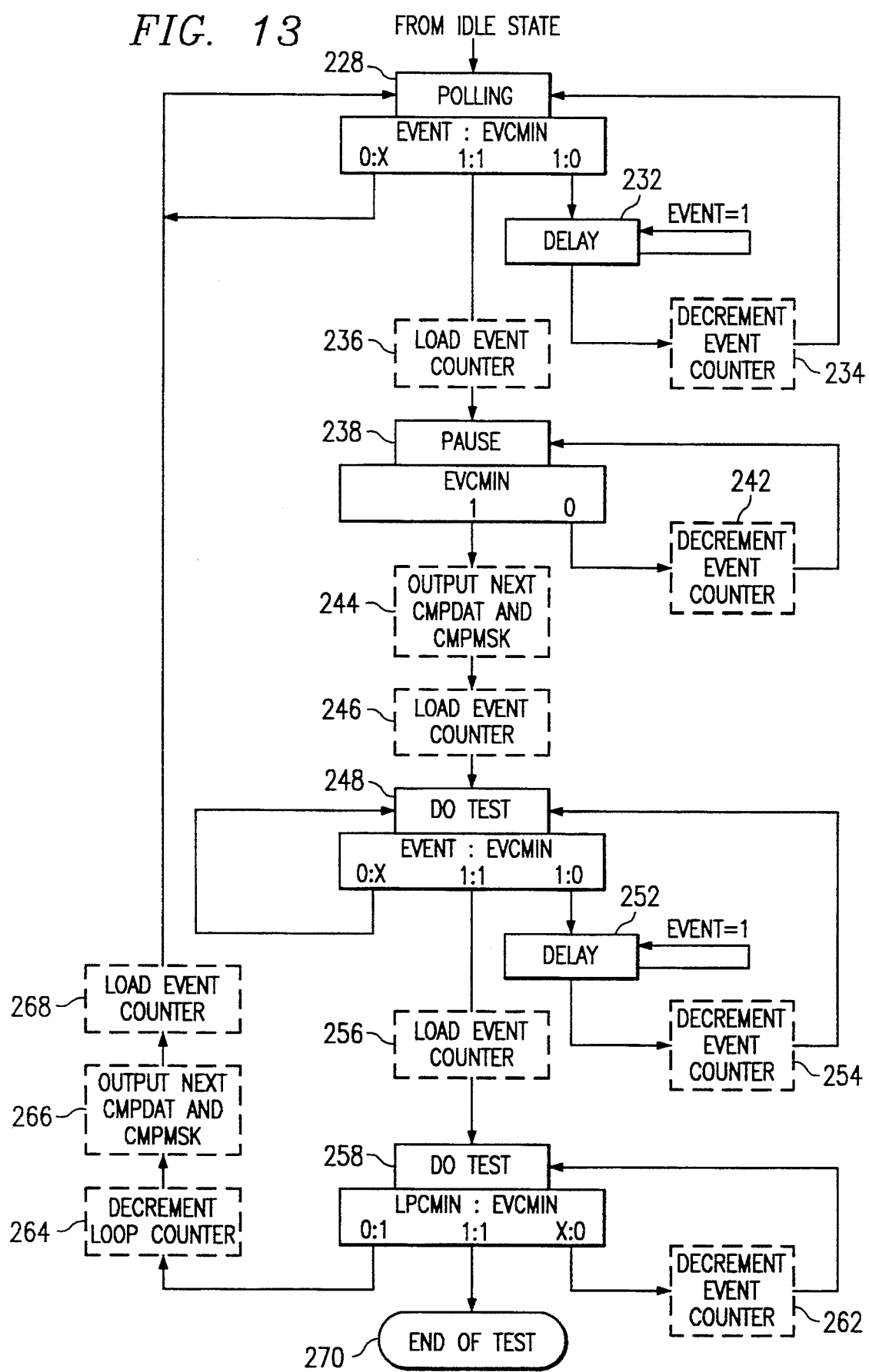

Protocol 6 operation allows a test or other procedure to be started "N" clocks after the detection of a first "Nth" event, stopped "N" clocks after the detection of a second "Nth" event, and repeated "M" times as illustrated by the pseudo-code below and state diagrams in FIG. 13.

During this protocol, the event counter 44 of FIG. 5 is used to delay the start of the operation until "N" occurrences of a first event have been detected. Each time the state machine 48 detects the expected first event it checks the event counter's EVCMIN signal to see if the counter is at a minimum count (state 228). If an event is detected and the event counter 44 is not at a minimum count, the state machine 48 waits for the event input to go away (state 232) then decrements the event counter 44 once (action 234) and begins monitoring for the next occurrence of the first event. If an event is detected and the event counter 44 is at a minimum count, the state machine 48 loads a new "N" count into the event counter 44 (action 236) and begins decrementing the event counter 44 once for each system clock input (state 238 and action 242).

When the event counter 44 reaches a minimum count, indicated by the EVCMIN signal, the state machine 48 loads the event counter 44 with a new "N" count (action 244), causes the memories inside the EQCs to output a new pair of CMPDAT and CMPMSK signals (action 246) to be used to compare against a second "Nth" event that will initiate the stoppage sequence the test operation and issues control to start the test operation (state 248). The capability of delaying the start of a test operation for a predetermined number of clocks allows starting the test operation at some point in time after the starting event.

After the test is started the state machine 48 uses the event counter 44 to delay stopping the test operation until "N" occurrences of the second event have been detected (state 248). Each time the state machine 48 detects the expected second event it checks the event counter's EVCMIN signal to see if the counter is at a minimum count. If an event is detected and the event counter 44 is not at a minimum count, the state machine 48 waits for the event input to go away (state 252) then decrements the event counter 44 once (action 254) and begins monitoring for the next occurrence of the second event. If an event is detected and the event counter 44 is at a minimum count, the state machine 48 loads a new "N" count into the event counter 44 (action 256) and begins decrementing the event counter 44 once for each system clock input. When the event counter 44 reaches a minimum count (state 258 and action 262), indicated by the EVCMIN signal, the state machine 48 issues control to stop the test operation. The capability of delaying the stopping of a test operation for a predetermined number of clocks allows stopping the test operation at some point in time after the stopping event.

The loop counter 42 is used to allow the above described protocol to be repeated "M" times. After each pass through the protocol, the state machine 48 checks the loop counter's LPCMIN signal to see if the counter is at a minimum count (state 258). If the loop counter 42 is not at a minimum count, the state machine 48 decrements the loop counter 42 once (action 264), issues control to load a new "N" count into the event counter 44 (action 266), causes the memories in the EQCs to output a new pair of CMPDAT and CMPMSK signals (action 268), and repeats the protocol sequence described above. If the loop counter 42 is at a minimum count, the state machine 48 transitions into the "end of test" state 270 to terminate the protocol.

The pseudo-code for Protocol 6 is:

```
For "M" times do
  Begin
    On "Nth" event start test after "N" clocks
    On "Nth" event stop test after "N" clocks
  End
End of test
```

Protocol 7

Figure 14:
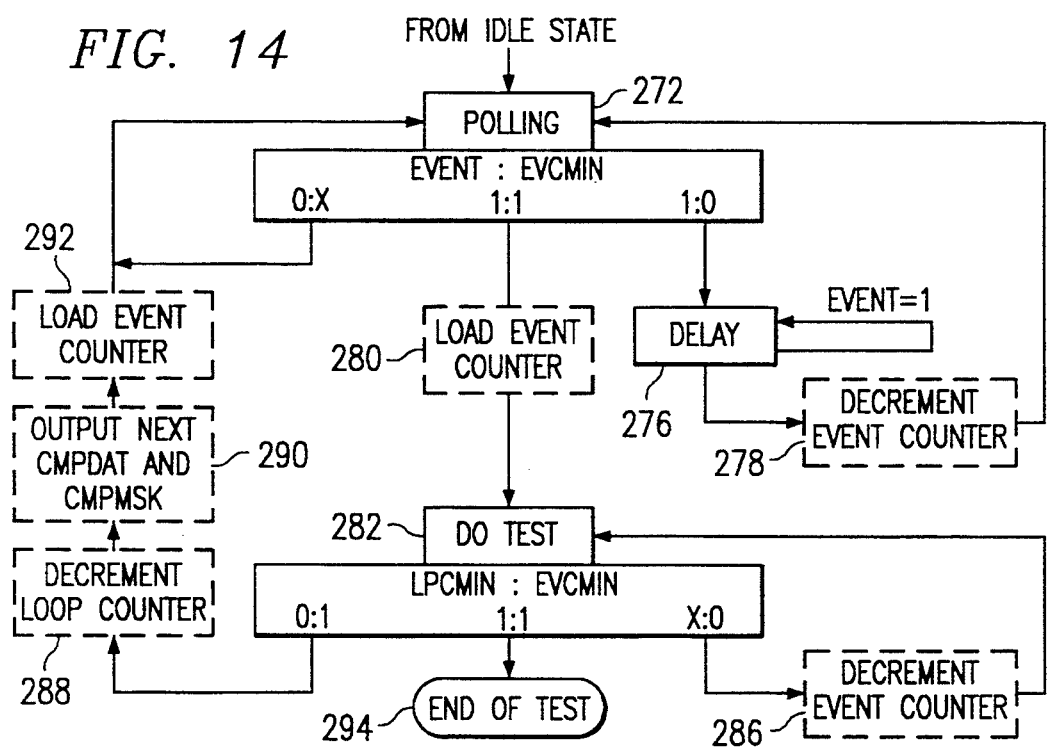

Protocol 7 operation allows a test or other procedure to be started in response to a first "Nth" event, stopped after "N" system clocks, and repeated "M times, as illustrated by the pseudo-code below and state diagrams in FIG. 14.

During this protocol the event counter 44 of FIG. 5 is used to delay the start of the operation until "N" occurrences of a first event have been detected. Each time the state machine 48 detects the expected first event it checks the event counter's EVCMIN signal to see if the counter is at a minimum count (state 272). If an event is detected and the event counter 44 is not at a minimum count, the state machine 48 waits for the event input to go away (state 276) then decrements the event counter 44 once (action 278) and begins monitoring for the next occurrence of the same event. If an event is detected and the event counter 44 is at a minimum count, the state machine 48 issues control to load the event counter 44 with a new "N" count equal to the number of system clocks that the test will be executed for (action 280) and to start a test operation (state 282). During the test, the event counter 44 is decremented once during each system clock input (state 282 and action 286). When the event counter 44 reaches a minimum count the state machine 48 stops the test operation.

The loop counter 42 is used to allow the above described protocol to be repeated "M" times. After each pass through the protocol, the state machine 48 checks the loop counter's LPCMIN signal to see if the counter is at a minimum count (state 282). If the loop counter 42 is not at a minimum count, the state machine 48 decrements the loop counter 42 once (action 288), issues control to load a new "N" count into the event counter 44 (action 290), causes the memories in the EQCs to output a new pair of CMPDAT and CMPMSK signals (action 292), and repeats the protocol sequence described above. If the loop counter 42 is at a minimum count, the state machine 48 transitions into the "end of test" state 294 to terminate the protocol.

The pseudo-code for Protocol 7 is:

```
For "M" times do
  Begin
    On "Nth" event do test for "N" clocks
  End
End of test
```

Protocol 8

Figure 15:
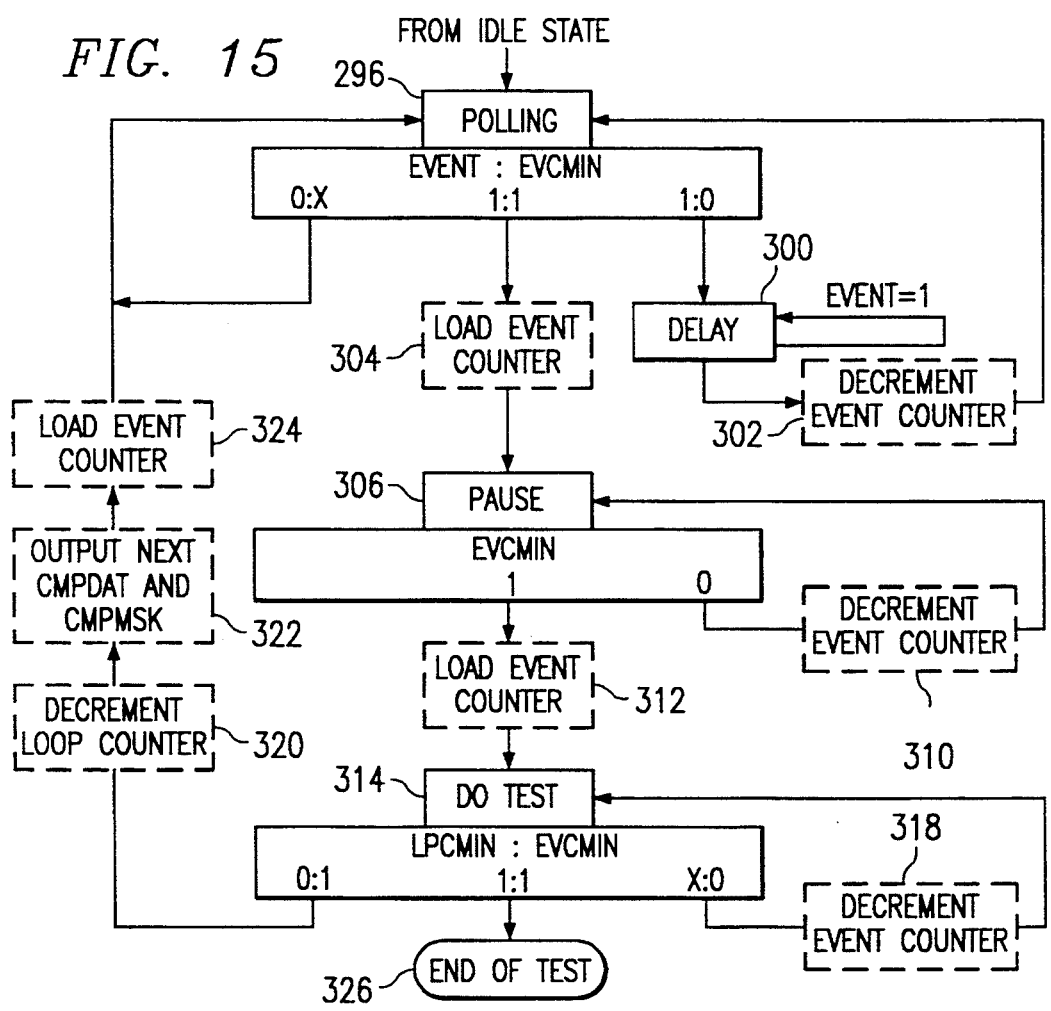
Figure 17:
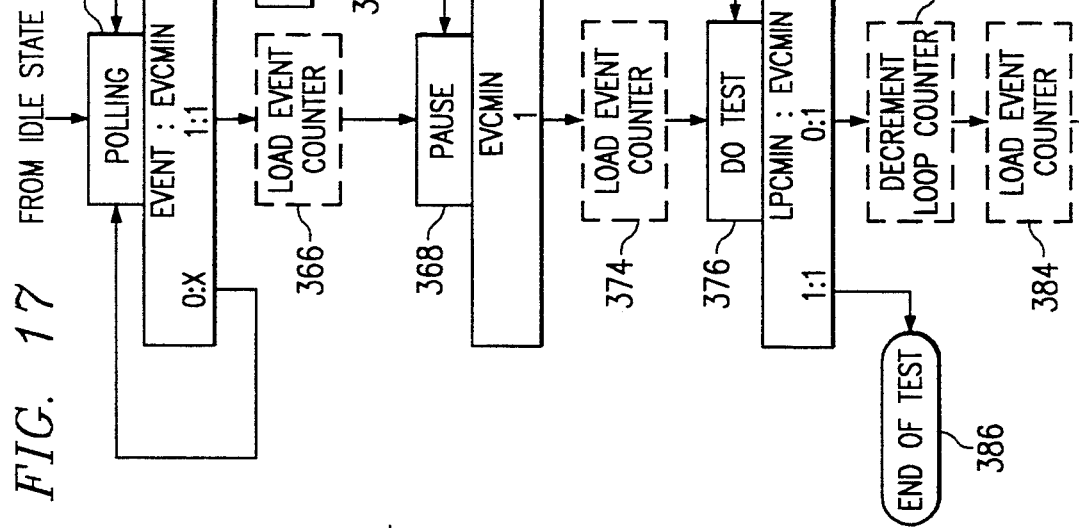

Protocol 8 operation allows a test or other procedure to be started "N" system clocks after the detection of an "Nth" event, stopped after "N" systems clocks, and repeated "M" times as illustrated by the pseudo-code below and state diagram of FIG. 15.

During this protocol, the event counter 44 of FIG. 5 is used to delay the start of the operation until "N" occurrences of an expected event have been detected. Each time the state machine 48 detects the expected event it checks the event counter's EVCMIN signal to see if the counter 44 is at a minimum count (state 296). If an event is detected and the event counter 44 is not at a minimum count, the state machine 48 waits for the event input to go away (state 300) then decrements the event counter 44 once (action 302) and begins monitoring for the next occurrence of the expected event. If an event is detected and the event counter 44 is at a minimum count, the state machine 48 loads a new "N" count into the event counter 44 (action 304). The "N" count is equal to the number of system clock cycles that must occur before the test operation can be started.

After the new count is loaded, the state machine 48 decrements the event counter 44 once for each system clock input it receives (state 306 and action 310). When the event counter 44 reaches a minimum count, indicated by the EVCMIN signal, the state machine 48 reloads the event counter 44 with a new "N" count equal to the number of system clock cycles that the test operation will execute for (action 312) and issues control to start the test operation (state 314). After the new count is loaded, the state machine 48 decrements the event counter 44 once for each system clock input it receives (state 314 and action 318). When the event counter 44 reaches a minimum count, the state machine 48 issues control to stop the test operation.

The loop counter 42 is used to allow the above described protocol to be repeated "M" times. After each pass through the protocol, the state machine 48 checks the loop counter's LPCMIN signal to see if the counter 42 is at a minimum count. If the loop counter 42 is not at a minimum count, the state machine 48 decrements the loop counter 42 once (action 320), issues control to load a new "N" count into the event counter 44 (action 322), causes the memories in the EQCs to output a new pair of CMPDAT and CMPMSK signals (action 324), and repeats the protocol sequence described above. If the loop counter 42 is at a minimum count, the state machine 48 transitions into the "end of test" state 326 to terminate the protocol.

```
For "M" times do
  Begin
    On "Nth" event;
      Pause of "N" clocks
      Do test for "N" clocks
  End
End of test
```

The pseudo-code for Protocol 8 is:

Protocol 9

Figure 16:
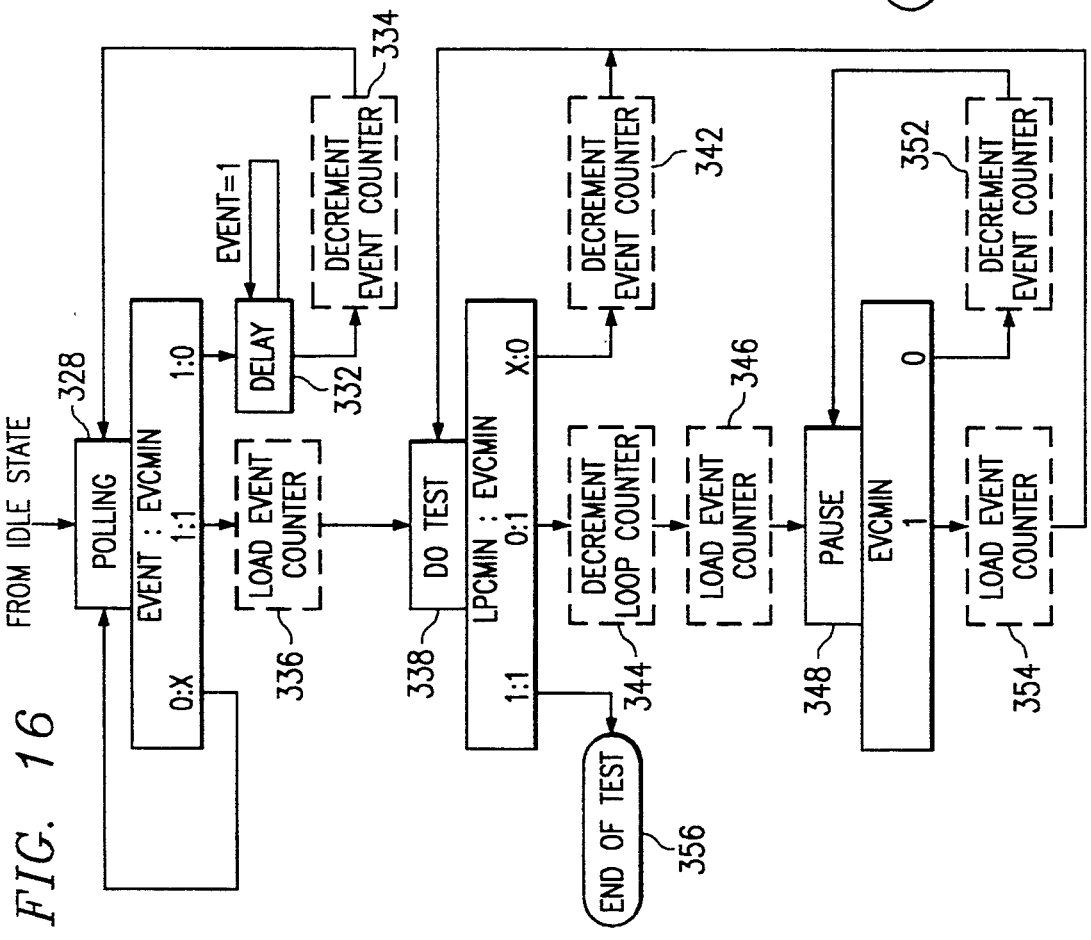

Protocol 9 operation allows a test or other procedure to be started in response to an "Nth" event, execute for "N" system clocks, then, if the loop counter 42 is not at a minimum count, pause for "N" system clocks before resuming the test again, as shown in the pseudo-code below and state diagram in FIG. 16.

During this protocol the event counter 44 of FIG. 5 is used to delay the start of the operation until "N" occurrences of a first event have been detected. Each time the state machine 48 detects the expected event it checks the event counter's EVCMIN signal to see if the counter is at a minimum count (state 328). If an event is detected and the event counter 44 is not at a minimum count, the state machine 48 waits for the event input to go away (state 332) then decrements the event counter 44 once (action 334) and begins monitoring for the next occurrence of the same event. If an event is detected and the event counter 44 is at a minimum count, the state machine 48 issues control to load the event counter 44 with a new "N" count equal to the number of system clocks that the test will be executed for (action 336) and to start a test operation (state 338). During the test, the event counter 44 is decremented once during each system clock input (state 338 and 342).

When the event counter 44 reaches a minimum count the state machine 48 stops the test operation and checks to see if the loop counter 42 is at a minimum count. Depending on whether the loop counter 42 is at a minimum count, the state machine takes one of two possible actions. In the first action where the loop counter 42 is not at a minimum count, as determined by checking the LPCMIN signal, the state machine 48 decrements the loop counter 42 once (action 344) then loads a new "N" count into the event counter 44 equal to the number of system clocks the test operation is to be paused (action 346). The event counter 44 is decremented once for each system clock input (state 348 and action 352). When the event counter 44 reaches a minimum count, a new "N" count is loaded into the event counter 44 (action 354) and the test operation is resumed until the event counter 44 once again reaches a minimum count, at which time the loop counter 42 is tested again for a minimum count as mentioned above. In the second action where the loop counter 42 is at a minimum count the protocol is terminated and the state machine 48 transitions into the "end of test" state 356.

The pseudo-code for Protocol 9 is:

```
Then For (M-1) times do
  Begin
    Pause for "N" clocks
    Do test for "N" clocks
  End
End of test
```

Protocol 10

Protocol 10 operation allows a test or other procedure to be initiated in response to an "Nth" event. Once initiated, the protocol will pause for "N" system clocks, execute for "N" system clocks, and repeat the pause and execute sequence "M" times as shown in the pseudo-code below and state diagram of FIG. 18.

During this protocol, the event counter 44 of FIG. 6 is used to delay the start of the operation until "N" occurrences of a first event have been detected. Each time the state machine 48 detects the expected event it checks the event counter's EVCMIN signal to see if the counter 44 is at a minimum count (state 358). If an event is detected and the event counter 44 is not at a minimum count, the state machine 48 waits for the event input to go away (state 362) then decrements the event counter 44 once (action 364) and begins monitoring for the next occurrence of the same event. If an event is detected and the event counter 44 is at a minimum count, the state machine 48 issues control to load the event counter 44 with a new "N" count equal to the number of system clocks that the actual start of the test will be delayed or paused for (action 366). During the pause operation, the event counter 44 is decremented once during each system clock input (state 368 and action 372).

When the event counter 44 reaches a minimum count, the state machine 48 issues control to start the test and load a new "N" count into the event counter 44 (action 374). During the test operation, the event counter 44 is decremented once during each system clock input (state 376 and action 380). When the event counter 44 reaches a minimum count, as determined by monitoring the EVCMIN signal, the state machine 48 stops the test operation checks the loop counter's LPCMIN signal to see if the loop counter 42 is at minimum count. If the loop counter 42 is not at a minimum count the state machine 48 decrements the loop counter 42 (action 382), loads a new "N" count into the event counter 44 (action 384) and repeats the above described (pause for "N" then test for "N") sequence. If the loop counter 42 is at a minimum count the state machine 48 will terminate the protocol and transition into the "end of test" state 386. The pseudo-code for Protocol 10 is:

```
For "M" times do
  Begin
    Pause for "N" clocks
    Do test for "N" CLOCKS
  End
End of test
```

Board Level Event Qualification

Figure 18:
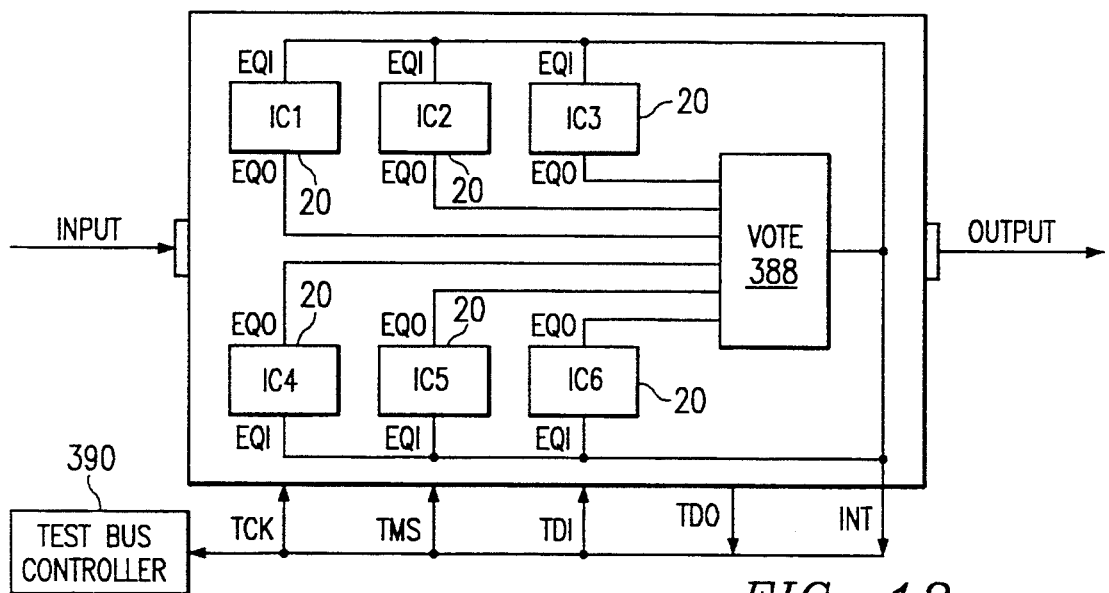
FIG. 18 illustrates a block diagram of a circuit board including a plurality of sub-circuits having the test architecture of the present invention.
Figure 19:
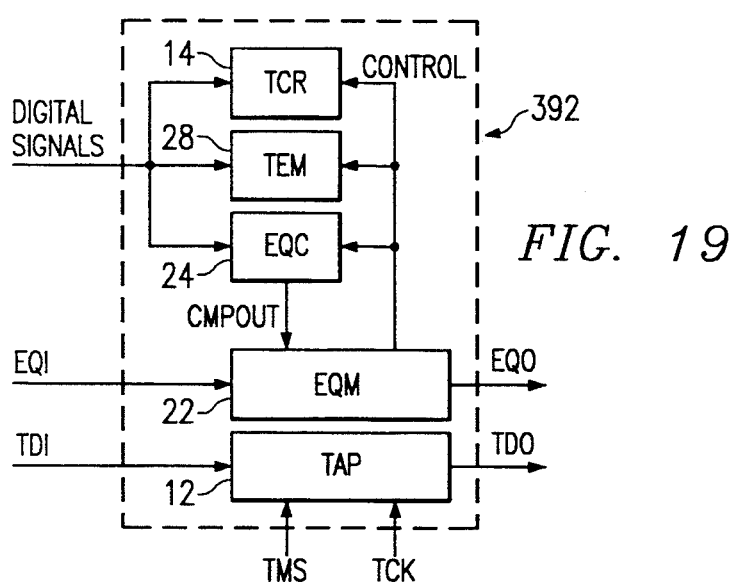
FIG. 19 illustrates a block diagram of a digital signal monitors using the present invention.

The event qualification architecture has been described hereinabove as it applies locally to the boundary of one IC. This section of the disclosure describes how multiple ICs can participate in the event qualification process. FIG. 18 illustrates a board design comprising multiple ICs 20 which include the event qualification architecture shown in FIG. 2 along with a voting circuit 388. The voting circuit is required for board level qualification and is used to combine all the EQO signals from each IC into a single signal that is fed back into each IC via the EQI input.

The board has input and output for system data, a 4-wire 1149.1 test bus interface (TCK<TMS<TDI and TDO signals), and an interrupt (INT) for outputting event signals. The 4-wire test bus and INT signal are coupled to a test bus controller 390. The test bus controller 390 serially accesses the ICs 20 on the board design, via the 1149.1 test bus, to set up and execute test operations and to extract test data obtained from the tests.

Board Level—Local Event Qualification

The ICs 20 in FIG. 18 can be set up for local qualification and test operations by scan access from the 1149.1 test bus controller. When the ICs 20 operate in local qualification mode, the test each IC performs is qualified only by the conditions occurring local to the IC's boundary. In this mode, all the ICs 20 of FIG. 18 can be made to concurrently execute individual test operations, with each test operation potentially being controlled by a different type of event qualification protocol. For example, some of the ICs can be set up to compress input and output data into their TCRs 14 and 16 using event qualification Protocol 3, while other ICs are set up to store input data into their internal TMEM 28 using event qualification Protocol 2.

During local qualification, the EQM state machine 48 selects the CTERM, shown in FIG. 6, to be the source of the event it monitors to start and stop a test protocol. The CTERM indicates the status of local compare operations occurring at the boundary of the host IC. Thus in local qualification mode, a protocol can be started and stopped only in response to compare operations occurring at the host ICs boundary.

Also during local qualification, the EQO outputs from each IC 20 are set to output the EOT status signal from the EQM state machine 48 in FIG. 6. The voting circuit 388 receives the EQO signals and outputs an EQI signal which is fed back to each IC's EQI input. The EQI output from the voting circuit 388 is also fed off-board via the INT signal. The voting circuit does not output the EQI signal until all ICs 20 have completed their local test operations (protocols) and have output an EOT status signal from their EQO outputs. By monitoring the INT output the test bus controller 390 can determine when all the test operations performed by each IC 20 has been completed. When the INT signal is detected, the test bus controller 390 executes scan operations to extract the test data collected in each IC for examination.

Board Level—Global Event Qualification

While local qualification serves many testing needs, there are times when the qualification of a test needs to be expanded beyond the boundary of the target IC. Increasing the number of boundary signals participating in the qualification process improves the resolution as to when a test operation is enabled. For example, the signals at one ICs boundary may not provide sufficient qualification for a particular test operation. However, by combining the boundary signals of neighboring ICs with the boundary signals of the target IC, a global qualification mode is obtained which can be used to more accurately enable the test operation.

During global qualification, the EQO signal from each IC 20 is set to output the result of the IC's local boundary compare operation. The EQO signals from all the ICs 20 are input to the voting circuit 388 so they can be combined into one composite global compare signal. Any IC that does not participate sets its EQO output to a state that will not interfere with the operation of the voting circuit (see EQODIS input to Mux2 54 in FIG. 6). The output of the voting circuit 388 is fed back into each IC's EQI input, to allow the EQM inside each IC 20 to monitor for the occurrence of a global compare signal.

Each time a match occurs across all the IC boundaries, the EQO outputs from the ICs 20 will all be enabled and the voting circuit 388 will output a global compare signal back to each IC's EQI input. The EQMs 22 of each IC 20 respond to the EQI inputs to execute a protocol to control a predetermined test operation. By monitoring the INT output the test bus controller 390 can determine when the global test operation is complete so that the test data obtained can be scanned out of the ICs for inspection.

Using only the EQM in IC designs

While this disclosure has described the event qualification architecture as comprising both the EQCs 24 and the EQM 22, it is possible to only use the EQM 22 when there is not enough logic in the IC to implement the EQCs 24. When only the EQM 22 is used, the EQI input serves as the single event input to start and stop the EQM's protocols. The operation of the EQM remains the same, the only difference is that the qualification of a test operation must always be input to the IC, via the EQI pin, instead of optionally being generated inside the IC. Since no internal qualification occurs when an IC does not include the EQCs, or similar compare circuitry, the EQO pin is used to only output either the EOT status signal from the EQM controller 38 or the EQODIS signal via Mux2 54 (see FIG. 6).

Using the Architecture in Different IC Architectures

Figure 20:
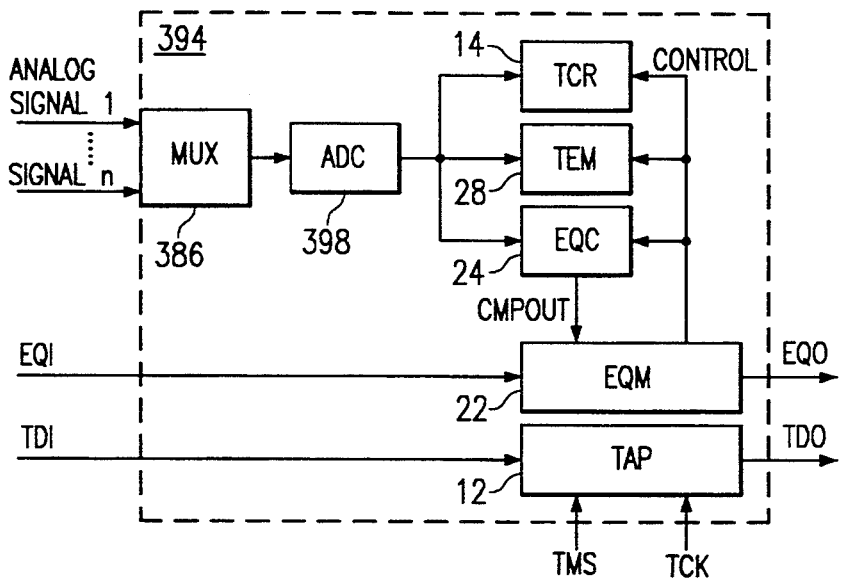
FIG. 20 illustrates a block diagram of an analog signal monitor using the present invention.

While this disclosure has illustrated the event qualification architecture as being included in the typical IC architecture of FIG. 2, it can be used in other types of IC architectures as well. Two IC architectures implementing the architecture are shown in FIGS. 20 and 21. These IC architectures differ from the one shown in FIG. 2 in that they only have input signals, test logic to receive the input signals, and the event qualification architecture.

Digital Signal Monitor

The digital signal monitor IC 392 of FIG. 20 comprises a TCR 14, TMEM 28, EQCs 24, EQM 22, and a TAP interface 12. The TAP provides serial access to the IC 392 for setting up test operations and extracting test results. The digital signals are input to the TCR 14 and TMEM 28 for monitoring and to the EQCs 24 for comparison against expected data. In operation, the EQM 22 receives an event input from either the EQCs 24 or from the EQI input to start execution of a predetermined protocol. When an event is received the protocol starts and the EQM 22 outputs control to cause the TCR 14 and TMEM 28 to start monitoring data. The TCR 14 can be set to sample a single data input pattern or compress a stream of data input patterns. The TMEM 28 can be set to store multiple data input patterns. When the protocol is complete, the EQM 22 outputs control to the TCR 14 and TMEM 28 causing them to stop monitoring data. After the test is complete the data stored in the TCR 14 and TMEM 28 can be scanned out via the TAP interface for examination.

Analog Signal Monitor

The analog signal monitor IC 394 of FIG. 21 comprises a TCR 14, TMEM 28, EQCs 24, EQM 22, TAP 12, analog multiplexer 396, and an analog-to-digital converter (ADC) 398. The analog signal monitor 394 receives multiple analog signal inputs into the analog multiplexer 396. The multiplexer selects one of the analog signal inputs to be input to the ADC 398. The ADC 398 converts the analog signal input into a digital pattern representative of the voltage of the analog signal. After one conversion is complete the conversion is repeated. Thus as the voltage of the analog signal changes, the digital output of the ADC 398 changes to reflect the new voltage of the analog signal. After the analog signal is converted into a digital form, the analog monitor operates exactly like the digital signal monitor of FIG. 20.

The digital pattern output from the ADC 398 is input to the TCR 14 and TMEM 28 for monitoring and to the EQCs 24 for comparison against expected data. The EQM 22 receives an event input from either the EQCs 24 or from the EQI input to start execution of a predetermined protocol. When an event is received the protocol starts and the EQM outputs control to cause the TCR 14 and TMEM 24 to start monitoring the digital pattern outputs from the ADC. The TCR can be set to sample a single digital pattern or compress a stream of digital patterns. The TMEM 24 can be set to store multiple digital patterns. When the protocol is complete, the EQM 22 outputs control to the TCR 14 and TMEM 24 causing them to stop monitoring data. After the test is complete the data stored in the TCR 14 and TMEM 24 can be scanned out via the TAP interface for examination.

The present invention overcomes the problems described in the 1149.1 Sample instruction and provides methods to perform other test functions beyond just sampling single data patterns. Since the present invention may be embedded in the IC itself, no external circuitry must be added to the circuit board to provide synchronization and qualification of external control inputs to perform an on-line test operation. Also, when the present invention is enabled to control a test operation, it operates independent from the IC's TAP, allowing different ICs to operate different tests at different times. Having local test control in each IC instead of a global test control input to all ICs, de-centralizes testing at the circuit board level.

Importantly, the present invention's ability to enable boundary test logic while the host IC is operating normally, allows testing the at-speed data transfers between ICs on a board design. Using this approach, it is possible to detect timing sensitive and/or intermittent data transfer failures that may occur between multiple ICs in a functioning circuit. These types of failures are very difficult if not impossible to detect without physically probing the board design.

In state-of-the-art board designs, using surface mount technology, physical access to probe a functioning board is usually very limited and in some cases does not exist at all. Also, in circuits designed using very high speed technologies, the electrical load associated with a probing instrument can affect the operation of the signals being probed, causing the circuit to malfunction.

The present invention provides an alternate method to test for at-speed related problems when physical probing of the board design is not possible or when probing affects the operation of the board. Since the present invention may be designed into ICs it remains in the product after it leaves the factory test floor. Thus it can be reused during other phases of the products life cycle such as; system integration, environmental testing, and field service and repair.

Although the preferred embodiment of the present invention has been described in detail, it should be understood that various changes, substitutions and alterations could be made herein without departing from the spirit and scope of the invention as defined by the appended claims.

What is claimed is:

1. A method of testing a circuit comprising the steps of:
    providing at least one event qualification cell having an internal memory and having compare circuitry for comparing data input into the compare circuitry with data stored in said internal memory;
    operating said event qualification cell for detecting each occurrence of a specified event;
    counting the number of occurrences of the specified event;
    executing a test responsive to detecting a predetermined number of occurrences of the specified event; and
    executing said test for a predetermined number of clocks.

2. The method of claim 1 and further comprising the step of repeating said counting and executing steps a predetermined number of times wherein the predetermined number of occurrences of the specified event may vary on each repetition.

3. The method of claim 1 and further comprising the steps of:
    detecting a second specified event;
    counting the number of occurrences of the second specified event; and
    stopping the test responsive to detection of a predetermined number of occurrences of the second specified event.

4. The method of claim 3 and further comprising the step of repeating a predetermined number of times said steps of counting the number of occurrences of the first specified event, executing a test, counting the number of occurrences of the second specified event and stopping the test wherein the predetermined number of occurrences of the first specified event and the predetermined number of occurrences second specified event may vary on each repetition.

5. The method of claim 3 wherein said stopping test step comprises the step of stopping the test responsive to detecting a predetermined number of clock cycles after a predetermined number of occurrences of the second specified event.

6. The method of claim 5 and further comprising the step of repeating a predetermined number of times said steps of counting the number of occurrences of the first event, executing a test responsive to detection of a predetermined number of occurrences of the first event, counting the number of occurrences of the second event, and stopping the test after detection of a predetermined number of occurrences of the second event wherein the predetermined number of occurrences of the first specified event, the predetermined number of clock cycles and the predetermined number of occurrences of the second specified event may vary on each repetition.

7. The method of claim 5 wherein said step of starting the test comprises the steps of pausing a predetermined number of clock cycles after detecting the predetermined number of occurrences of said first event and executing the test after pausing.

8. The method of claim 7 and further comprising the step of repeating a predetermined number of times said steps of counting the number of occurrences of the first event, pausing a predetermined number of clock cycles after detection of a predetermined number of occurrences of the first event, executing the test after pausing, counting the number of occurrences of the second event, and stopping the test after detection of a predetermined number of occurrences of the second event wherein the predetermined number of occurrences of the first specified event, predetermined number of occurrences of the second specified event, predetermined number of pausing clock cycles and predetermined number of clock cycles after detecting said first event may vary on each repetition.

9. The method of claim 1 wherein said executing step comprises the step of executing the test for a predetermined number of clock cycles and further comprising the steps of pausing the test for a predetermined number of clocks and resuming the test for a predetermined number of clocks.

10. The method of claim 9 and further comprising the step of repeating said pausing and resuming steps a predetermined number of times wherein the predetermined number of clocks for pausing and predetermined clocks for resuming may vary on each repetition.

11. The method of claim 1 wherein said executing step comprises the step of pausing a predetermined number of clock cycles after detecting a predetermined number of occurrences of the specified event and executing the test after pausing.

12. The method of claim 11 and further comprising the step of stopping the test after detecting a predetermined number of second events.

13. The method of claim 12 and further comprising the step of repeating said counting, executing and stopping steps a predetermined number of times wherein the predetermined number of occurrences of said first event, said predetermined number of occurrences of said second event and predetermined number of clocks may vary on each repetition.

14. The method of claim 1 and further comprising the step of repeating said counting, pausing and executing steps a predetermined number of times.

15. The method of claim 1 wherein said executing step comprises the step of pausing for a predetermined number of clocks and executing the test for a predetermined number of clocks after said pausing step.

16. The method of claim 15 and further comprising the step of repeating said counting, pausing and executing steps for a predetermined number of times wherein said predetermined number of occurrences of the specified event, predetermined number of clocks to pause and predetermined number of clocks to test may vary on each repetition.

17. The method of claim 1 and further comprising the step of repeating said counting and executing steps a predetermined number of times wherein said predetermined number of occurrences of the specified event and predetermined number of clocks may vary on each repetition.

18. The method of claim 1 wherein said executing step comprises the steps of pausing a predetermined number of clocks and executing the test a predetermined number of clocks.

19. The method of claim 18 and further comprising the step of repeating said pausing and executing steps a predetermined number of times wherein said predetermined number of clocks for pausing and predetermined number of clocks for testing may vary on each repetition.

20. A method of testing a circuit comprising the steps of:
providing at least one event qualification cell having an internal memory and having compare circuitry for comparing data input into the compare circuitry with data stored in said internal memory;
operating said event qualification cell for detecting each occurrence of a specified event;
counting the number of occurrences of the specified event;
executing a test for a predetermined number of clocks during a predetermined occurrence of the event.

21. The method of claim 20 and further comprising the step of repeating said counting and executing steps a predetermined number of times wherein said predetermined number of occurrences of the specified event may vary on each repetition.

22. Circuitry for testing a circuit comprising:
at least one event qualification cell having an internal memory and having compare circuitry for comparing data input into the compare circuitry with data stored in said internal memory, operable for detecting each occurrence of a specified event;
circuitry for counting the number of occurrences of the specified event;
circuitry for executing a test responsive to detecting a predetermined number of occurrences of the specified event; and
circuitry for causing said test to execute for a predetermined number of clocks.

23. The circuitry of claim 22 and further comprising circuitry for repeating said test a predetermined number of times.

24. The circuitry of claim 22 and further comprising:
circuitry for detecting a second specified event;
circuitry for counting the number of occurrences of the second specified event; and
circuitry for stopping the test responsive to detection of a predetermined number of occurrences of the second specified event.

25. The circuitry of claim 24 and further comprising circuitry for repeating said test a predetermined number of times responsive to said counting circuitry and said stopping circuitry.

26. The circuitry of claim 24 wherein said circuitry for stopping comprises circuitry for stopping the test a predetermined number of clock cycles after a predetermined number of occurrences of the second specified event.

27. The circuitry of claim 26 and further comprising circuitry for repeating said test a predetermined number of times responsive to said circuitry for counting the number of occurrences of the first event, circuitry for counting the number of occurrences of the second event, and circuitry for stopping the test after detection of a predetermined number of occurrences of the second event.

28. The circuitry of claim 26 wherein said circuitry for starting the test comprises circuitry for pausing a predetermined number of clock cycles after detecting the predetermined number of occurrences of said first event and circuitry for executing the test after pausing.

29. The circuitry of claim 28 and further comprising circuitry for repeating the test a predetermined number of times responsive to said circuitry for counting the number of occurrences of the first event, circuitry for pausing, circuitry for executing the test after pausing, circuitry for counting the number of occurrences of the second event, and circuitry for stopping the test after detection of a predetermined number of occurrences of the second event.

30. The circuitry of claim 22 wherein said executing circuitry comprises circuitry for executing the test for a predetermined number of clock cycles and further comprising circuitry for pausing for a predetermined number of clocks and resuming the test for a predetermined number of clocks.

31. The circuitry of claim 30 and further comprising circuitry for continuing the test responsive to said circuitry for pausing and circuitry for resuming.

32. The circuitry of claim 22 wherein said circuitry for executing comprises circuitry for pausing a predetermined number of clock cycles after detecting a predetermined number of occurrences of the specified event and executing the test after pausing.

33. The circuitry of claim 32 and further comprising circuitry for stopping the test after detecting predetermined number of second events.

34. The circuitry of claim 33 and further comprising circuitry for repeating the test responsive to said circuitry for counting, circuitry for executing and circuitry for stopping.

35. The circuitry of claim 32 and further comprising circuitry for repeating the test responsive to said circuitry for counting, circuitry for pausing and circuitry for executing.

36. The circuitry of claim 22 wherein said circuitry for executing comprises circuitry for pausing for a predetermined number of clocks and executing the test for a predetermined number of clocks after pausing.

37. The circuitry of claim 36 and further comprising circuitry for repeating the test responsive to said circuitry for counting, circuitry for pausing and circuitry for executing.

38. The circuitry of claim 32 and further comprising circuitry for repeating the test responsive to said circuitry for counting and circuitry for executing.

39. The circuitry of claim 22 wherein said circuitry for executing comprises circuitry for pausing a predetermined number of clocks and circuitry for executing the test for a predetermined number of clocks.

40. The circuitry of claim 39 and further comprising circuitry for continuing the test responsive to said circuitry for pausing and circuitry for executing.

41. Circuitry for testing a circuit comprising:

at least one event qualification cell having an internal memory and having compare circuitry for comparing data input into the compare circuitry with data stored in said internal memory, operable for detecting each occurrence of a specified event;

circuitry for counting the number of occurrences of the specified event; and circuitry for executing a test for a predetermined number of clocks during a predetermined occurrence of the event.

42. The circuitry of claim 41 and further comprising circuitry for repeating the test responsive to said circuitry for counting and circuitry for executing.

* * * * *